(12) United States Patent
Muraoka et al.

(10) Patent No.: US 12,360,644 B2
(45) Date of Patent: Jul. 15, 2025

(54) RX ELECTRODE FOR CAPACITIVE TOUCH SENSOR, CAPACITIVE TOUCH SENSOR, AND NOISE REDUCTION METHOD

(71) Applicant: HOSIDEN CORPORATION, Yao (JP)

(72) Inventors: Shunji Muraoka, Yao (JP); Tomoya Hirano, Yao (JP); Kazuhiro Yamamoto, Yao (JP)

(73) Assignee: HOSIDEN CORPORATION, Yao (JP)

( * ) Notice: Subject to any disclaimer, the term of this patent is extended or adjusted under 35 U.S.C. 154(b) by 163 days.

(21) Appl. No.: 18/380,735

(22) Filed: Oct. 17, 2023

(65) Prior Publication Data

US 2024/0160327 A1 May 16, 2024

(30) Foreign Application Priority Data

Nov. 11, 2022 (JP) ................. 2022-181238

(51) Int. Cl.
*G06F 3/044* (2006.01)
*G06F 3/041* (2006.01)

(52) U.S. Cl.
CPC .......... *G06F 3/0448* (2019.05); *G06F 3/0418* (2013.01)

(58) Field of Classification Search
CPC ........ G06F 3/041; G06F 3/044; G06F 3/0418; G06F 3/04162; G06F 3/04164; G06F 3/0448; G01D 5/24
See application file for complete search history.

(56) References Cited

U.S. PATENT DOCUMENTS

| 10,459,623 | B2* | 10/2019 | Hoch | G06F 3/04883 |
| 11,243,622 | B2* | 2/2022 | Kent | G06F 3/0418 |
| 2013/0062181 | A1* | 3/2013 | Tokura | G06F 3/0446 200/600 |
| 2013/0285972 | A1* | 10/2013 | Elias | G06F 3/0445 345/174 |
| 2020/0252063 | A1 | 8/2020 | Mokuo et al. | |

FOREIGN PATENT DOCUMENTS

JP 2020-126764 A 8/2020

* cited by examiner

*Primary Examiner* — Neel D Shah
(74) *Attorney, Agent, or Firm* — Kilyk & Bowersox, P.L.L.C.

(57) ABSTRACT

An RX electrode for a capacitive touch sensor including an electrode body, which includes first to fourth conductors, one of which includes a connecting portion. The first and second conductors are arrayed and located close to each other with a gap therebetween in a first direction, extend in a second direction. Application of external noise to the electrode body induces current flows in opposite directions through the first and second conductors, so that an electric field generated in the first conductor and an electric field generated in the second conductor offset each other. The third conductor, located on the one side in the second direction relative to the gap, connects first end portions of the first and second conductors. The fourth conductor, located on the other side in the second direction relative to the gap, connects second end portions of the first and second conductors.

20 Claims, 18 Drawing Sheets

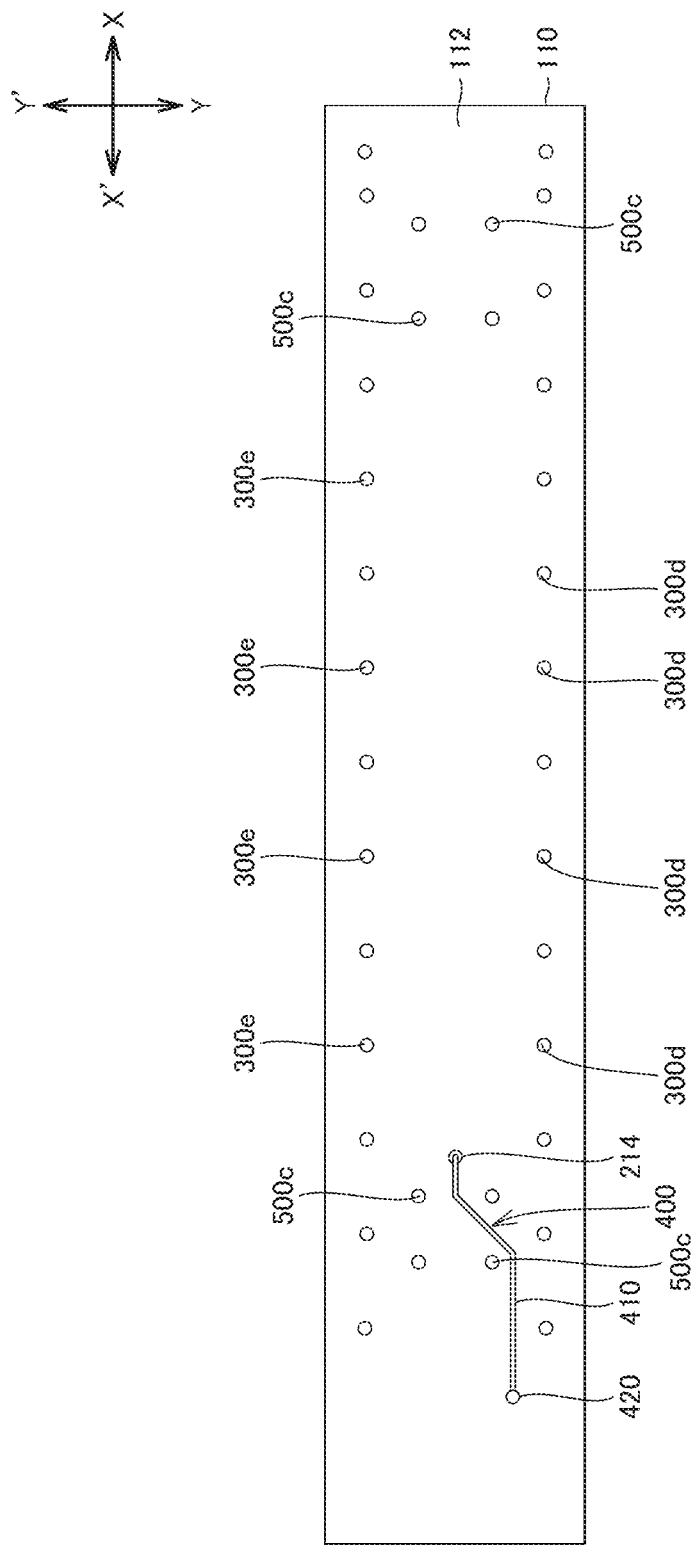

RX ELECTRODE FOR CAPACITIVE TOUCH SENSOR, CAPACITIVE TOUCH SENSOR, AND NOISE REDUCTION METHOD

CROSS-REFERENCE TO RELATED APPLICATIONS

The present application claims priority under 35 U.S.C. § 119 of Japanese Patent Application No. 2022-181238 filed on Nov. 11, 2022, the disclosure of which is expressly incorporated by reference herein in its entirety.

BACKGROUND OF THE INVENTION

Technical Field

The invention relates to an RX electrode for a capacitive touch sensor, a capacitive touch sensor, and a noise reduction method.

Background Art

JP 2020-126764 A discloses a conventional capacitive touch sensor including a circuit board and at least one RX electrode provided on the circuit board. The at least one RX electrode includes three segmented electrodes, which are spaced apart from each other in the longitudinal direction of the circuit board and electrically connected to each other.

SUMMARY OF INVENTION

In the conventional touch sensor, there are weak Coulomb forces generated between adjacent ones of the three segmented electrodes. Also, the conventional touch sensor is susceptible to external noise (immunity noise).

The invention provides an RX electrode for a capacitive touch sensor that is less susceptible to external noise, a capacitive touch sensor, and a noise reduction method.

An RX electrode for a capacitive touch sensor according to an aspect of the invention includes an electrode body. The electrode body includes a first conductor, a second conductor, a third conductor, and a fourth conductor. The first and second conductors are located close to each other with a gap therebetween in a first direction and extend in a second direction. The first direction is an array direction of the first and second conductors, and the second direction is substantially orthogonal to the first direction. The first and second conductors are configured such that application of external noise to the electrode body induces current flows in opposite directions through the first and second conductors, so that an electric field generated in the first conductor and an electric field generated in the second conductor offset each other. The first and second conductors each include a first end portion on one side in the second direction and a second end portion on the other side in the second direction. The third conductor connects the first end portion of the first conductor and the first end portion of the second conductor, and is located on the one side in the second direction relative to the gap between the first conductor and the second conductor. The fourth conductor connects the second end portion of the first conductor and the second end portion of the second conductor, and is located on the other side in the second direction relative to the gap between the first conductor and the second conductor. One of the first, second, third, or fourth conductor includes a connecting portion.

In the RX electrode of this aspect, the electrode body of the RX electrode is shaped like a loop antenna shape formed by the first conductor, the second conductor, the third conductor, and the fourth conductor. When external noise is applied to the electrode body, the application induces current flows in opposite directions through the first and second conductors, so that an electric field generated in the first conductor and an electric field generated in the second conductor offset each other. The RX electrode is therefore less susceptible to external noise.

A maximum distance in the first direction between the first conductor and the second conductor may be 0.05 mm or larger, for example. The maximum distance in the first direction between the first conductor and the second conductor may be from 2 mm to 0.05 mm or from 1 mm to 0.05 mm, for example.

A capacitive touch sensor according to an aspect of the invention may include a base having an insulating property, the RX electrode according to one of the above aspects, and a TX electrode. The RX electrode may be provided at the base. The TX electrode may be provided at the base and located near the RX electrode.

The touch sensor may be configured such that a signal of the RX electrode changes in accordance with a change in electrostatic capacitance between a detection target and the RX electrode caused by approach of the detection target to the RX electrode, and in accordance with a change in electrostatic capacitance between the TX electrode and the RX electrode caused by approach of the detection target to the TX electrode and the RX electrode.

The base may include at least one dielectric having an insulating property. The base may include a plurality of dielectrics having an insulating property and being stacked together.

The TX electrode and the electrode body of the RX electrode may be provided on one and the same face of one dielectric of the at least one dielectric.

The TX electrode and the electrode body of the RX electrode may be provided on different faces of one dielectric of the plurality of dielectrics. Alternatively, the TX electrode may be provided on a face of one dielectric of the plurality of dielectrics and the electrode body of the RX electrode is provided on a face of another dielectric, other than the one dielectric, of the plurality of dielectrics.

The TX electrode may include at least one of a first TX electrode having a generally ring shape and surrounding the RX electrode, a second TX electrode, or a third TX electrode.

The first TX electrode may have a generally ring shape and surround the RX electrode.

The first TX electrode may include a first conductor, a second conductor, a third conductor, and a fourth conductor. The first conductor of the first TX electrode may extend in the second direction and be located on one side in the first direction relative to the first conductor of the RX electrode. The first conductor of the first TX electrode may include a first end portion on the one side in the second direction and a second end portion on the other side in the second direction. The second conductor of the first TX electrode may extend in the second direction and be located on the other side in the first direction relative to the second conductor of the RX electrode. The second conductor of the first TX electrode may include a first end portion on the one side in the second direction and a second end portion on the other side in the second direction. The third conductor of the first TX electrode may extend from the first end portion of the first conductor of the first TX electrode to the first end portion of the second conductor of the first TX electrode and be located on the one side in the second direction relative to the RX electrode. The fourth conductor of the first TX electrode may extend from the second end portion of the first conductor of the first TX electrode to the second end portion of the second conductor of the first TX electrode and be located on the other side in the second direction relative to the RX electrode.

The second TX electrode may extend in the second direction and be located on one side in the first direction relative to the first conductor of the RX electrode.

The third TX electrode may extend in the second direction and be located on the other side in the first direction relative to the second conductor of the RX electrode.

A noise reduction method according to an aspect of the invention is a method for suppressing external noise applied to the RX electrode according to one of the aspects described above. The method may include inducing current flows in opposite directions through the first and second conductors, so that an electric field generated in the first conductor and an electric field generated in the second conductor to offset each other, wherein the current flows are induced by application of external noise to the electrode body.

BRIEF DESCRIPTION OF DRAWINGS

FIG. 2B is a schematic bottom view of the first dielectric of the base of the touch sensor of the first embodiment.

Figure 1A:
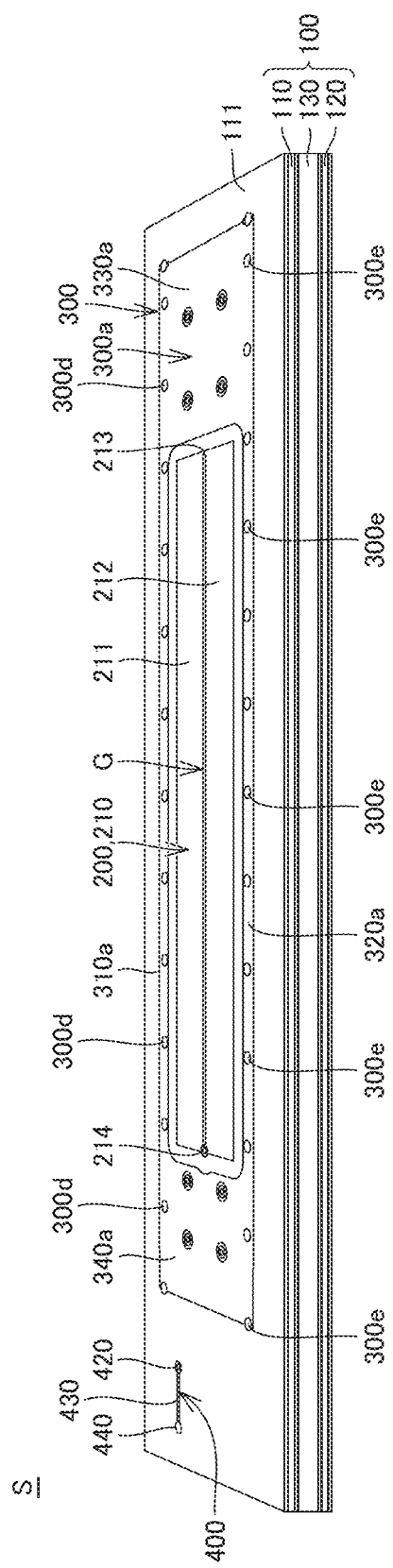
FIG. 1A is a schematic perspective view of a capacitive touch sensor according to a first embodiment of the invention.

In the brief description of the drawings above and the description of embodiments which follows, relative spatial terms such as "upper", "lower", "top", "bottom", "left", "right", "front", "rear", etc., are used for the convenience of the skilled reader and refer to the orientation of the RX electrode for a capacitive touch sensor and the capacitive touch sensor, as well as their constituent parts as depicted in the drawings. No limitation is intended by use of these terms, either in use of the invention, during its manufacture, shipment, custody, or sale, or during assembly of its constituent parts or when incorporated into or combined with other apparatus.

DESCRIPTION OF EMBODIMENTS

Hereinafter described are a plurality of embodiments, including a first embodiment and variants thereof, of the invention. It should be noted that constituents of the embodiments and their variants to be described can be combined in any possible manner. It should also be noted that the materials, the shapes, the dimensions, the numbers, the arrangements, etc. of the constituents of the embodiments and their variants to be described are presented by way of example only and can be modified in any manner as long as the same functions can be fulfilled.

First Embodiment

Hereinafter described is a capacitive touch sensor S according to a plurality of embodiments, including a first embodiment and variants thereof, of the invention with reference to FIGS. 1A to 2D. FIGS. 1A to 2D illustrate the touch sensor S of the first embodiment. The touch sensor S is of a combined self-capacitive and mutual-capacitive type. FIGS. 1C to 2D show a Y-Y' direction (first direction). The Y-Y' direction includes a Y direction (one side in the first direction) and a Y' direction (the other side in the first direction). FIGS. 1B and 2A to 2D show an X-X' direction (second direction) substantially orthogonal to the Y-Y' direction. The X-X' direction includes an X direction (one side in the second direction) and an X' direction (the other side in the second direction). FIGS. 1B to 1C show a Z-Z' direction (third direction) substantially orthogonal to the Y-Y' and X-X' directions. The Z-Z' direction includes a Z direction (one side in the third direction) and a Z' direction (the other side in the third direction).

The touch sensor S includes a base 100 having an insulating property. The base 100 may have a flat shape extending in the Y-Y' and X-X' directions (see FIGS. 1A to 1C), or may be partly or entirely bent to form a curved surface protruding in the Z or Z' direction (not illustrated). The base 100 includes at least one dielectric having an insulating property. The at least one dielectric includes one dielectric (not illustrated) having an insulating property or includes a plurality of dielectrics (see FIGS. 1A to 1C) having an insulating property and being stacked together in the Z-Z' direction. For example, the at least one dielectric may (1) include a first dielectric 110 (not illustrated); (2) include a first dielectric 110 and a second dielectric 120 stacked together in the Z-Z' direction (not illustrated); or (3) include a first dielectric 110, a second dielectric 120, and one or more third dielectrics 130 stacked together in the Z-Z' direction, with the one or more third dielectrics 130 interposed between the first dielectric 110 and the second dielectric 120 (see FIGS. 1A to 2D).

The first dielectric 110 has a first face 111 on the Z-direction side and a second face 112 on the Z'-direction side. The second dielectric 120 has a first face 121 on the Z-direction side and a second face 122 on the Z'-direction side. The one third dielectric 130 has a first face 131 on the Z-direction side and a second face 132 on the Z'-direction side. Each of the third dielectrics 130 has a first face 131 on the Z-direction side and a second face 132 on the Z'-direction side.

The touch sensor S further includes an RX electrode 200 (receiver electrode). The RX electrode 200 includes an electrode body 210.

The electrode body 210 includes a first conductor 211 and a second conductor 212. The first conductor 211 and the second conductor 212 may be constituted by a transparent conductive film or a conductor, and may be provided on the first or second face of one dielectric of all the dielectrics (the first or second face of one dielectric of the at least one dielectric) of the base 100. For example, where the at least one dielectric has one of the configurations (1) to (3) described above, the first conductor 211 and the second conductor 212 may be provided on the first face 111 of the first dielectric 110. The transparent conductive film can be formed of, for example, tin-doped indium oxide (ITO), carbon nanotubes (CNT), indium-doped zinc oxide (IZO), aluminum-doped zinc oxide (AZO), conductive polymer such as PEDOT and PSS, or the like. The conductor may be formed of, for example, photosensitive silver, silver nanoink, silver nanowires, vapor-deposited copper, rolled copper, copper nanoink, or the like.

The first conductor 211 and the second conductor 212 extend in the X-X' direction. Each of the first conductor 211 and the second conductor 212 is larger in dimension in the X-X' direction than in dimension in the Y-Y' direction. The first conductor 211 and the second conductor 212 are located close to each other with a gap G therebetween in the Y-Y' direction. The Y-Y' direction corresponds to an array direction of the first conductor 211 and the second conductor 212.

The first conductor 211 includes a first end portion 211a on the X-direction side, a second end portion 211b on the X'-direction side, an inner end 211c on the Y'-direction side, and an outer end 211d on the Y-direction side. The second conductor 212 includes a first end portion 212a on the X-direction side, a second end portion 212b on the X'-direction side, an inner end 212c on the Y-direction side, and an outer end 212d on the Y'-direction side. The inner end 211c of the first conductor 211 and the inner end 212c of the second conductor 212 are opposed to each other with the gap G therebetween in the Y-Y' direction. The inner end 211c of the first conductor 211 and the inner end 212c of the second conductor 212 further have one of the following configurations (A) to (E).

Figure 1B:
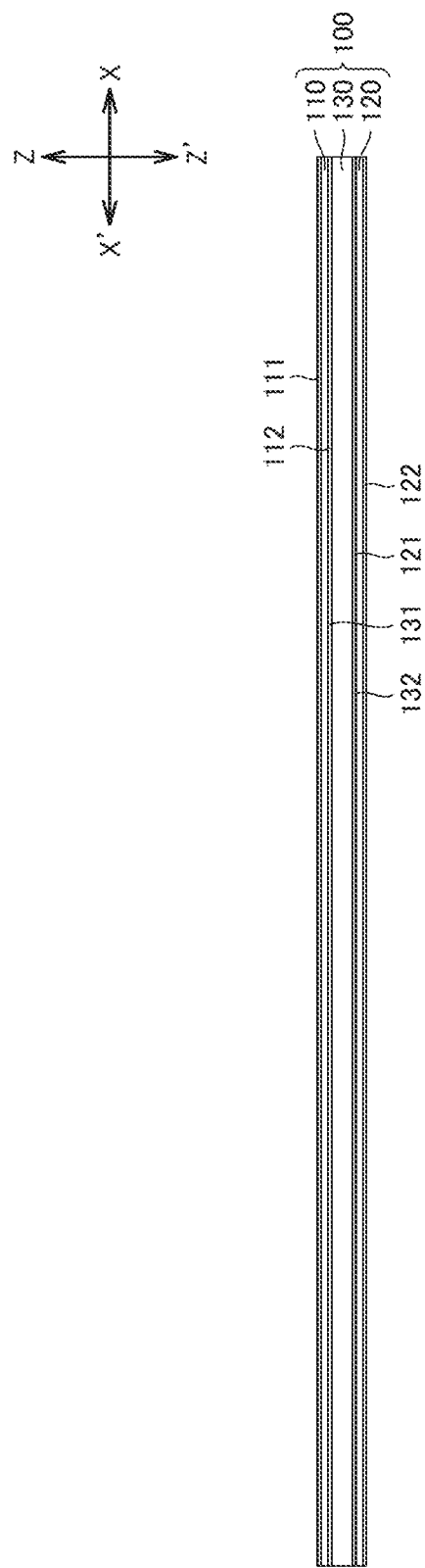
FIG. 1B is a schematic front view of the touch sensor of the first embodiment.
Figure 1C:
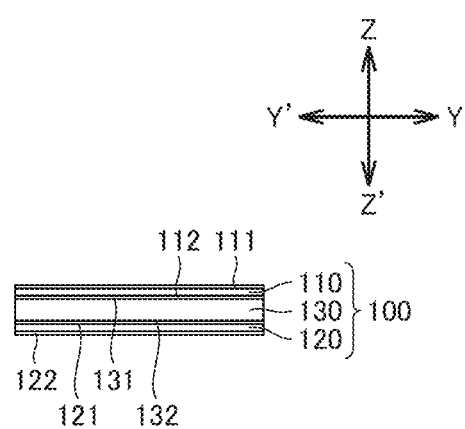
FIG. 1C is a schematic side view of the touch sensor of the first embodiment.
Figure 2A:
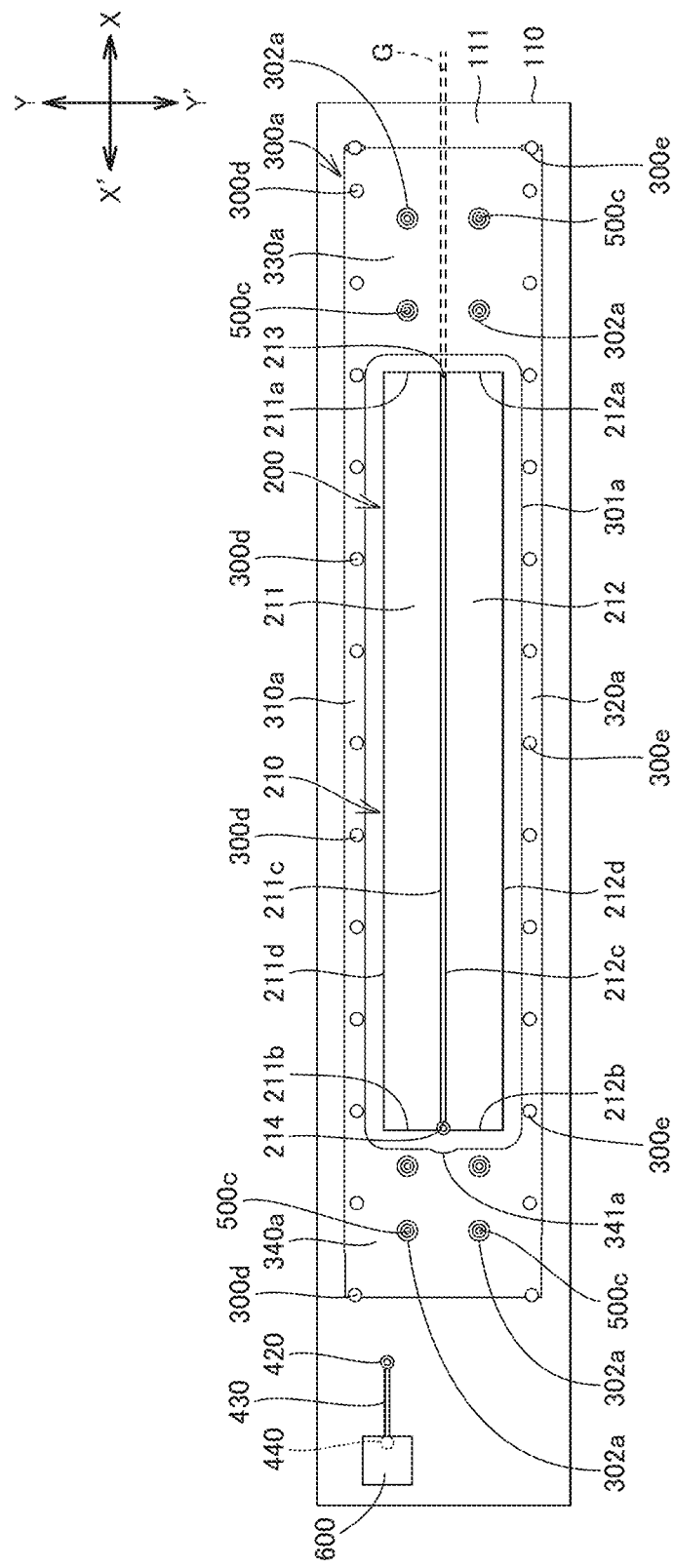
FIG. 2A is a schematic plan view of a first dielectric of a base of the touch sensor of the first embodiment.

(A) The inner end 211c of the first conductor 211 and the inner end 212c of the second conductor 212 extend straight in the X-X' direction (see FIGS. 1A and 2A). In this case, the distance in the Y-Y' direction between the inner end 211c of the first conductor 211 and the inner end 212c of the second conductor 212 is substantially constant from the ends on the X-direction side of the inner end 211c of the first conductor 211 and the inner end 212c of the second conductor 212 to the ends on the X'-direction side of the inner end 211c of the first conductor 211 and the inner end 212c of the second conductor 212.

(B) The inner end 211c of the first conductor 211 has an arc shape protruding to the Y'-direction side, and the inner end 212c of the second conductor 212 has an arc shape protruding to the Y-direction side (not illustrated). In this case, the minimum distance in the Y-Y' direction between the first conductor 211 and the second conductor 212 is the distance in the Y-Y' direction between the top of the inner end 211c of the first conductor 211 and the top of the inner end 212c of the second conductor 212, and the maximum distance in the Y-Y' direction between the first conductor 211 and the second conductor 212 is the distance in the Y-Y' direction between the end on the X-direction side of the inner end 211c of the first conductor 211 and the end on the X-direction side of the inner end 212c of the second conductor 212 and/or the distance in the Y-Y' direction between the end on the X'-direction side of the inner end 211c of the first conductor 211 and the end on the X'-direction side of the inner end 212c of the second conductor 212.

(C) The inner end 211c of the first conductor 211 has an arc shape recessed to the Y-direction side, and the inner end 212c of the second conductor 212 has an arc shape recessed to the Y'-direction side (not illustrated). In this case, the maximum distance in the Y-Y' direction between the first conductor 211 and the second conductor 212 is the distance in the Y-Y' direction between the top of the inner end 211c of the first conductor 211 and the top of the inner end 212c of the second conductor 212, and the minimum distance in the Y-Y' direction between the first conductor 211 and the second conductor 212 is the distance in the Y-Y' direction between the end on the X-direction side of the inner end 211c of the first conductor 211 and the end on the X-direction side of the inner end 212c of the second conductor 212 and/or the distance in the Y-Y' direction between the end on the X'-direction side of the inner end 211c of the first conductor 211 and the end on the X'-direction side of the inner end 212c of the second conductor 212.

(D) The inner end 211c of the first conductor 211 has an arc shape protruding to the Y'-direction side and the inner end 212c of the second conductor 212 has an arc shape recessed to the Y'-direction side (not illustrated). Alternatively, the inner end 211c of the first conductor 211 has an arc shape recessed to the Y-direction side and the inner end 212c of the second conductor 212 has an arc shape protruding to the Y-direction side (not illustrated). In either of these cases, the distance in the Y-Y' direction between the inner end 211c of the first conductor 211 and the inner end 212c of the second conductor 212 is substantially constant from the ends on the X-direction side of the inner end 211c of the first conductor 211 and the inner end 212c of the second conductor 212 to the ends on the X'-direction side of the inner end 211c of the first conductor 211 and the inner end 212c of the second conductor 212.

(E) The distance between the inner end 211c of the first conductor 211 and the inner end 212c of the second conductor 212 gradually increases or decreases from the ends on the X-direction side of the inner end 211c and the inner end 212c to the ends on the X'-direction side of the inner end 211c and the inner end 212c (not illustrated). In the former case (in the case of increasing distance), the maximum distance in the Y-Y' direction between the first conductor 211 and the second conductor 212 is the distance in the Y-Y' direction between the end on the X'-direction side of the inner end 211c and the end on the X'-direction side of the inner end 212c, and the minimum distance in the Y-Y' direction between the first conductor 211 and the second conductor 212 is the distance in the Y-Y' direction between the end on the X-direction side of the inner end 211c and the end on the X-direction side of the inner end 212c. In the latter case (in the case of case of decreasing distance), vice versa.

In any of the above any cases, the maximum distance in the Y-Y' direction between the first conductor 211 and the second conductor 212 (i.e., the maximum distance in the Y-Y' direction between the inner end 211c of the first conductor 211 and the inner end 212c of the second conductor 212 (hereinafter, the maximum distance may also be referred to as a "dimension of the gap G")) may be 0.05 mm or larger, for example. The dimension of the gap G may be from 2 mm to 0.05 mm or from 1 mm to 0.05 mm, for example. The dimension of the gap G may be 0.2 mm or 0.1 mm.

The outer end 211d of the first conductor 211 may have any shape. For example, the outer end 211d of the first conductor 211 may extend straight in the X-X' direction (see FIGS. 1A and 2A), may have an arc shape protruding to the Y-direction side (not illustrated), may have an arc shape recessed to the Y'-direction side (not illustrated), may be inclined in the Y' and X directions (not illustrated), or may be inclined in the Y and X directions (not illustrated).

The outer end 212d of the second conductor 212 may have any shape. For example, the outer end 212d of the second conductor 212 may extend straight in the X-X' direction (see FIGS. 1A and 2A), may have an arc shape protruding to the Y'-direction side (not illustrated), may have an arc shape recessed to the Y-direction side (not illustrated), may be inclined in the Y' and X directions (not illustrated), or may be inclined in the Y and X directions (not illustrated).

The electrode body 210 further includes a third conductor 213 and a fourth conductor 214. The third conductor 213 of the electrode body 210 connects the first end portion 211a of the first conductor 211 and the first end portion 212a of the second conductor 212, and is located on the X-direction side relative to the gap G between the first conductor 211 and the second conductor 212. The fourth conductor 214 connects the second end portion 211b of the first conductor 211 and the second end portion 212b of the second conductor 212, and is located on the X'-direction side relative to the gap G between the first conductor 211 and the second conductor 212. The RX electrode 200 thus configured is shaped like a loop antenna.

One of the first conductor 211, the second conductor 212, the third conductor 213, and the fourth conductor 214 includes a connecting portion. For example, where the fourth conductor 214 includes a connecting portion, the third conductor 213 and the fourth conductor 214 may be configured as the follows.

The third conductor 213 is constituted by the transparent conductive film or conductor described above, and is provided on a face that is either the first or second face of one dielectric of all the dielectrics of the base 100 (either the first or second face of one dielectric of the at least one dielectric of the base 100) and that is provided with the first conductor 211 and the second conductor 212. Where the first conductor 211 and the second conductor 212 are provided on the first face 111 of the first dielectric 110, the third conductor 213 is also provided on the first face 111 of the first dielectric 110 (see FIGS. 1A and 2A). The third conductor 213 may extend straight in the Y-Y' direction, from the first end portion 211a of the first conductor 211 to the first end portion 212a of the second conductor 212 (see FIGS. 1A and 2A), or may extend in an arc shape protruding to the X-direction side, from the first end portion 211a of the first conductor 211 to the first end portion 212a of the second conductor 212 (not illustrated).

The fourth conductor 214 doubles as the connecting portion. Specifically, the fourth conductor 214 may be a through-hole electrode extending in the Z-Z' direction through all the dielectrics (the at least one dielectric) of the base 100 (see FIGS. 1A to 2D); a via-hole electrode extending in the Z-Z' direction through one or more dielectrics (the number of which is smaller than that of all the dielectrics) of all the dielectrics (the at least one dielectric) of the base 100 (not illustrated); or an electrode (not illustrated) provided on a face that is either the first or second face of one dielectric of all the dielectrics of the base 100 and that is provided with the first conductor 211 and the second conductor 212; or the like. The fourth conductor 214 is connected to the second end portion 211b of the first conductor 211 and to the second end portion 212b of the second conductor 212. The fourth conductor 214 may, but is not required to, be connected to a corner on the Y'-direction side of the second end portion 211b of the first conductor 211 and to a corner on the Y-direction side of the second end portion 212b of the second conductor 212 (see FIGS. 1A and 2A). The fourth conductor 214 may be located such as to partly protrude relative to the end on the X'-direction side of the second end portion 211b of the first conductor 211 and relative to the end on the X'-direction side of the second end portion 212b of the second conductor 212 (see FIGS. 1A and 2A). Alternatively, the end on the X'-direction side of the fourth conductor 214 may substantially coincide, in the X-X' direction, with the end on the X'-direction side of the second end portion 211b of the first conductor 211 and with the end on the X'-direction side of the second end portion 212b of the second conductor 212 (not illustrated).

Where the third conductor 213 includes the connecting portion (not illustrated), the third conductor 213 may have the same configuration as the fourth conductor 214 described in the preceding paragraph, except that the third conductor 213 connects the first end portion 211a of the first conductor 211 and the first end portion 212a of the second conductor 212; and also the fourth conductor 214 may have the same configuration as the third conductor 213 made of the above-described transparent conductive film or conductor, except that the fourth conductor 214 connects the second end portion 211b of the first conductor 211 and the second end portion 212b of the second conductor 212. The fourth conductor 214 may extend straight in the Y-Y' direction, from the second end portion 211b of the first conductor 211 to the second end portion 212b of the second conductor 212, or alternatively may extend in an arc shape protruding to the X'-direction side, from the second end portion 211b of the first conductor 211 to the second end portion 212b of the second conductor 212.

Where the first conductor 211 or the second conductor 212 includes the connecting portion (not illustrated), the first conductor 211 or the second conductor 212 may include the above-described transparent conductive film or conductor and the connecting portion. The connecting portion of the first conductor 211 or the second conductor 212 may be, for example, a through-hole electrode extending in the Z-Z' direction through all the dielectrics (the at least one dielectric) of the base 100 and being connected to the above-described transparent conductive film or conductor; a via-hole electrode extending in the Z-Z' direction through one or more dielectrics (the number of which is smaller than that of all the dielectrics) of all the dielectrics (the at least one dielectric) of the base 100; or an electrode (not illustrated) provided on a face that is either the first or second face of one dielectric of all the dielectrics of the base 100 and that is provided with the first conductor 211 and the second conductor 212; or the like. In any of these cases, the third conductor 213 and the fourth conductor 214 are constituted by the above-described transparent conductive film or conductor. Also, the third conductor 213 or the fourth conductor 214 may also include the above-described transparent conductive film or conductor and the connecting portion. In this case, the connecting portion of the third conductor 213 or the fourth conductor 214 may have the same configuration as the connecting portion of the first conductor 211 or the second conductor 212.

The touch sensor S further includes a TX electrode 300 (transmitter electrode). The TX electrode 300 is provided at the base 100 and located in the vicinity of the RX electrode 200. The TX electrode 300 and the electrode body 210 of the RX electrode 200 may be provided on one and the same face of one dielectric of the at least one dielectric of the base 100, or may be provided on different faces of one dielectric of the plurality of dielectrics of the base 100. Alternatively, the TX electrode 300 may be provided on a face of one dielectric of the plurality of dielectrics, and the electrode body 210 of the RX electrode 200 may be provided on a face of another dielectric, other than the one dielectric, of the plurality of dielectrics.

The TX electrode 300 may include a first TX electrode 300*a* having a generally ring shape, a second TX electrode 300*b*, and a third TX electrode 300*c*, for example.

Where the at least one dielectric of the base 100 has one of configurations (1) to (3) described above, the first TX electrode 300*a* may be provided on a face that is either the first or second face of one dielectric of all the dielectrics of the base 100 (either the first or second face of one dielectric of the at least one dielectric of the base 100) and that is provided with the electrode body 210 of the RX electrode 200, and may surround the electrode body 210 of the RX electrode 200 with a space therebetween; or alternatively, the first TX electrode 300*a* may be provided on a face that is either the first or second face of the one dielectric and that is not provided with the electrode body 210 of the RX electrode 200, and may surround the electrode body 210 of the RX electrode 200. Where the at least one dielectric of the base 100 has configuration (2) or (3) described above, the first TX electrode 300*a* may be provided on the first or second face of another dielectric, other than one dielectric that is provided with the electrode body 210 of the RX electrode 200, of all the dielectrics (the at least one dielectric) of the base 100, and may surround the RX electrode 200.

Where the at least one dielectric of the base 100 has one of configurations (1) to (3) described above, the second TX electrode 300*b* and the third TX electrode 300*c* may be provided on a face that is either the first or second face of one dielectric of all the dielectrics of the base 100 (either the first or second face of one dielectric of the at least one dielectric of the base 100) and that is provided with the electrode body 210 of the RX electrode 200, and may be is located in spaced relation to, and on the Y-direction side and the Y'-direction side, respectively, relative to, the electrode body 210 of the RX electrode 200; or alternatively, the second TX electrode 300*b* and the third TX electrode 300*c* may be provided on a face that is either the first or second face of the one dielectric and that is not provided with the electrode body 210 of the RX electrode 200, and may be is located on the Y-direction side and the Y'-direction side, respectively, relative to the electrode body 210 of the RX electrode 200. Where the at least one dielectric of the base 100 has configuration (2) or (3) described above, the second TX electrode 300*b* and the third TX electrode 300*c* may be provided on a first or second face of another dielectric, other than the one dielectric that is provided with the electrode body 210 of the RX electrode 200, of all the dielectrics (the at least one dielectric) of the base 100, and may be is located on the Y-direction side and the Y'-direction side, respectively, relative to the RX electrode 200. It should be noted that, in any of the above cases, the second TX electrode 300*b* and the third TX electrode 300*c*, and the first TX electrode 300*a* are not provided on one and the same face of the one dielectric.

Where the at least one dielectric of the base 100 has configuration (1) described above and the electrode body 210 of the RX electrode 200 is provided on the first face 111 of the first dielectric 110, the first TX electrode 300*a*, the second TX electrode 300*b*, and the third TX electrode 300*c* may have either of the following configurations (a) and (b) (not illustrated).

(a) The first TX electrode 300*a* is provided on the first face 111 of the first dielectric 110 and surrounds the RX electrode 200. The second TX electrode 300*b* is provided on the second face 112 of the first dielectric 110 and located on the Y-direction side relative to the first conductor 211 of the RX electrode 200. The third TX electrode 300*c* is provided on the second face 112 of the first dielectric 110 and located on the Y'-direction side relative to the second conductor 212 of the RX electrode 200.

(b) The first TX electrode 300*a* is provided on the second face 112 of the first dielectric 110 and surrounds the RX electrode 200. The second TX electrode 300*b* is provided on the first face 111 of the first dielectric 110 and located on the Y-direction side relative to the first conductor 211 of the RX electrode 200. The third TX electrode 300*c* is provided on the first face 111 of the first dielectric 110 and located on the Y'-direction side relative to the second conductor 212 of the RX electrode 200.

Where the at least one dielectric of the base 100 has configuration (2) described above and the electrode body 210 of the RX electrode 200 is provided on the first face 111 of the first dielectric 110, the first TX electrode 300*a*, the second TX electrode 300*b*, and the third TX electrode 300*c* may have one of the following configurations (c) to (h) (not illustrated).

(c) The first TX electrode 300*a* is provided on the first face 111 of the first dielectric 110 and surrounds the RX electrode 200. The second TX electrode 300*b* is provided on the second face 112 of the first dielectric 110 and located on the Y-direction side relative to the first conductor 211 of the RX electrode 200. The third TX electrode 300*c* is provided on the second face 112 of the first dielectric 110 and located on the Y'-direction side relative to the second conductor 212 of the RX electrode 200.

(d) The first TX electrode 300*a* is provided on the second face 112 of the first dielectric 110 and surrounds the RX electrode 200. The second TX electrode 300*b* is provided on the first face 111 of the first dielectric 110 and located on the Y-direction side relative to the first conductor 211 of the RX electrode 200. The third TX electrode 300*c* is provided on the first face 111 of the first dielectric 110 and located on the Y'-direction side relative to the second conductor 212 of the RX electrode 200.

(e) The first TX electrode 300*a* is provided on the first face 111 of the first dielectric 110 and surrounds the RX electrode 200. The second TX electrode 300*b* is provided on the second face 122 of the second dielectric 120 and located on the Y-direction side relative to the first conductor 211 of the RX electrode 200. The third TX electrode 300*c* is provided on the second face 122 of the second dielectric 120 and located on the Y'-direction side relative to the second conductor 212 of the RX electrode 200.

(f) The first TX electrode 300*a* is provided on the second face 112 of the first dielectric 110 and surrounds the RX electrode 200. The second TX electrode 300*b* is provided on the second face 122 of the second dielectric 120 and located on the Y-direction side relative to the first conductor 211 of the RX electrode 200. The third TX electrode 300*c* is provided on the second face 122 of the second dielectric 120 and located on the Y'-direction side relative to the second conductor 212 of the RX electrode 200.

(g) The first TX electrode 300*a* is provided on the second face 122 of the second dielectric 120 and surrounds the RX electrode 200. The second TX electrode 300*b* is provided on the first face 111 of the first dielectric 110 and located on the Y-direction side relative to the first conductor 211 of the RX electrode 200. The third TX electrode 300*c* is provided on the first face 111 of the first dielectric 110 and located on the Y'-direction side relative to the second conductor 212 of the RX electrode 200.

(h) The first TX electrode 300*a* is provided on the second face 122 of the second dielectric 120 and surrounds the RX electrode 200. The second TX electrode 300*b* is provided on the second face 112 of the first dielectric 110 and located on the Y-direction side relative to the first conductor 211 of the RX electrode 200. The third TX electrode 300*c* is provided on the second face 112 of the first dielectric 110 and located on the Y'-direction side relative to the second conductor 212 of the RX electrode 200.

Where the at least one dielectric has configuration (3) described above and the electrode body 210 of the RX electrode 200 is provided on the first face 111 of the first dielectric 110, the first TX electrode 300*a*, the second TX electrode 300*b*, and the third TX electrode 300*c* may have one of the following configurations (i) to (n).

(i) The first TX electrode 300*a* is provided on the first face 111 of the first dielectric 110 and surrounds the RX electrode 200 (see FIGS. 1A to 2D). The second TX electrode 300*b* is provided on the first or second face of one dielectric among the second dielectric 120 and the one or more third dielectrics 130, and located on the Y-direction side relative to the first conductor 211 of the RX electrode 200. The third TX electrode 300*c* is provided on the first or second face of the one dielectric and located on the Y'-direction side relative to the second conductor 212 of the RX electrode 200. FIGS. 1A to 2D illustrates an aspect in which the second TX electrode 300*b* and the third TX electrode 300*c* are provided on the second face 122 of the second dielectric 120.

(j) The first TX electrode 300*a* is provided on the first or second face of one dielectric among the second dielectric 120 and the one or more third dielectrics 130, and surrounds the RX electrode 200 (not illustrated). The second TX electrode 300*b* is provided on the first face 111 of the first dielectric 110 and located on the Y-direction side relative to the first conductor 211 of the RX electrode 200 (not illustrated). The third TX electrode 300*c* is provided on the first face 111 of the first dielectric 110 and located on the Y'-direction side relative to the second conductor 212 of the RX electrode 200 (not illustrated).

(k) The first TX electrode 300*a* is provided on the second face 112 of the first dielectric 110 and surrounds the RX electrode 200 (not illustrated). The second TX electrode 300*b* is provided on the first face of one dielectric among the second dielectric 120 and the one or more third dielectrics 130 (where the one dielectric is the one single third dielectric 130, the first face is not the first face 131 of the single third dielectric 130; where the one dielectric is the third dielectric 130 on the most Z-direction side among the plurality of third dielectrics 130, the first face is not the first face 131 of the third dielectric 130 on the most Z-direction side) or provided on the second face of the one dielectric, and located on the Y-direction side relative to the first conductor 211 of the RX electrode 200 (not illustrated). The third TX electrode 300*c* is provided on the first face of the one dielectric (where the one dielectric is the one single third dielectric 130, the first face is not the first face 131 of the single third dielectric 130; where the one dielectric is the third dielectric 130 on the most Z-direction side among the plurality of third dielectrics 130, the first face is not the first face 131 of the third dielectric 130 on the most Z-direction side) or provided on the second face of the one dielectric, and located on the Y'-direction side relative to the second conductor 212 of the RX electrode 200 (not illustrated).

(1) The first TX electrode 300*a* is provided on the first face of one dielectric among the second dielectric 120 and the one or more third dielectrics 130 (where the one dielectric is the one single third dielectric 130, the first face is not the first face 131 of the single third dielectric 130; where the one dielectric is the third dielectric 130 on the most Z-direction side among the plurality of third dielectrics 130, the first face is not the first face 131 of the third dielectric 130 on the most Z-direction side) or provided on the second face of the one dielectric, and surrounds the RX electrode 200 (not illustrated). The second TX electrode 300*b* is provided on the second face 112 of the first dielectric 110 and located on the Y-direction side relative to the first conductor 211 of the RX electrode 200 (not illustrated). The third TX electrode 300*c* is provided on the second face 112 of the first dielectric 110 and located on the Y'-direction side relative to the second conductor 212 of the RX electrode 200 (not illustrated).

(m) The first TX electrode 300*a* is provided on the first or second face of one dielectric among the second dielectric 120 and the one or more third dielectrics 130, and surrounds the RX electrode 200 (not illustrated). The second TX electrode 300*b* is provided on the second or first face of the one dielectric (i.e., on the face that is not provided with the first TX electrode 300*a*), and located on the Y-direction side relative to the first conductor 211 of the RX electrode 200 (not illustrated). The third TX electrode 300*c* is provided on the second face or the first face of the one dielectric (i.e., on the face that is not provided with the first TX electrode 300*a*), and located on the Y'-direction side relative to the second conductor 212 of the RX electrode 200 (not illustrated).

(n) The first TX electrode 300*a* is provided on the first or second face of one of the one or more third dielectrics 130, and surrounds the RX electrode 200 (not illustrated). The second TX electrode 300*b* is provided on the first or second face of another dielectric, other than the one dielectric, among the one or more third dielectrics 130, and located on the Y-direction side relative to the first conductor 211 of the RX electrode 200 (not illustrated). The third TX electrode 300*c* is provided on the first or second face of the another dielectric and located on the Y'-direction side relative to the second conductor 212 of the RX electrode 200 (not illustrated).

Irrespective of which of the above-described configurations the first TX electrode 300*a* has, the first TX electrode 300*a* includes a first conductor 310*a*, a second conductor 320*a*, a third conductor 330*a*, and a fourth conductor 340*a*. The first conductor 310*a*, the second conductor 320*a*, the third conductor 330*a*, and the fourth conductor 340*a* define a first opening 301*a* of the first TX electrode 300*a*.

The first conductor 310a of the first TX electrode 300a extends in the X-X' direction, is located on the Y-direction side relative to the first conductor 211 of the RX electrode 200, and includes a first end portion on the X-direction side and a second end portion on the X'-direction side. The second conductor 320a of the first TX electrode 300a extends in the X-X' direction, is located on the Y'-direction side relative to the second conductor 212 of the RX electrode 200, and includes a first end portion on the X-direction side and a second end portion on the X'-direction side. The third conductor 330a of the first TX electrode 300a extends in the Y-Y' direction from the first end portion of the first conductor 310a of the first TX electrode 300a to the first end portion of the second conductor 320a of the first TX electrode 300a, and is located on the X-direction side relative to the RX electrode 200. The fourth conductor 340a of the first TX electrode 300a extends in the Y-Y' direction from the second end portion of the first conductor 310a of the first TX electrode 300a to the second end portion of the second conductor 320a of the first TX electrode 300a, and is located on the X'-direction side relative to the RX electrode 200.

Where the first TX electrode 300a and the electrode body 210 of the RX electrode 200 are provided on the first face 111 of the first dielectric 110 (on one and the same face), the first conductor 310a of the first TX electrode 300a is located in spaced relation to, and on the Y-direction side relative to, the first conductor 211 of the RX electrode 200; the second conductor 320a of the first TX electrode 300a is located in spaced relation to, and on the Y'-direction side relative to, the second conductor 212 of the RX electrode 200; the third conductor 330a of the first TX electrode 300a is located in spaced relation to, and on the X-direction side relative to, the RX electrode 200; and the fourth conductor 340a of the first TX electrode 300a is located in spaced relation to, and on the X'-direction side relative to, the RX electrode 200. A distance in the Y-Y' direction between the first conductor 310a of the first TX electrode 300a and the first conductor 211 of the RX electrode 200, a distance in the Y-Y' direction between the second conductor 320a of the first TX electrode 300a and the second conductor 212 of the RX electrode 200, a distance in the X-X' direction between the third conductor 330a of the first TX electrode 300a and the RX electrode 200, and a distance in the X-X' direction between the fourth conductor 340a of the first TX electrode 300a and the RX electrode 200 may be substantially the same as each other or different from each other.

Where the fourth conductor 214 of the RX electrode 200 partly protrude relative to the end on the X'-direction side of the second end portion 211b of the first conductor 211 and relative to the end on the X'-direction side of the second end portion 212b of the second conductor 212, the fourth conductor 340a of the first TX electrode 300a may be provided with a recess 341a recessed to the X'-direction side.

Each of the second TX electrode 300b and the third TX electrode 300c has a dimension in the X-X' direction that may be larger than the dimension in the X-X' direction of the electrode body 210 of the RX electrode 200 and equal to, or smaller than, the dimension in the X-X' of the first TX electrode 300a.

Where the second TX electrode 300b and the electrode body 210 of the RX electrode 200 are provided on the first face 111 of the first dielectric 110 (on one and the same face), the second TX electrode 300b is located in spaced relation to, and on the Y-direction side relative to, the first conductor 211 of the RX electrode 200. Where the third TX electrode 300c and the electrode body 210 of the RX electrode 200 are provided on the first face 111 of the first dielectric 110 (on one and the same face), the third TX electrode 300c is located in spaced relation to, and on the Y'-direction side relative to, the second conductor 212 of the RX electrode 200. A distance in the Y-Y' direction between the second TX electrode 300b and the electrode body 210 of the RX electrode 200 and a distance in the Y-Y' direction between the third TX electrode 300c and the electrode body 210 of the RX electrode 200 may be substantially the same as each other or different from each other.

The TX electrode 300 further includes one or more first through-hole electrodes 300d or one or more first via-hole electrodes (not illustrated) and further includes one or more second through-hole electrodes 300e or one or more second via-hole electrodes (not illustrated). Each of the one or more first through-hole electrodes 300d and the one or more second through-hole electrodes 300e extend in the Z-Z' direction through all the dielectrics (the at least one dielectric) of the base 100. Each of the one or more first via-hole electrodes and the one or more second via-hole electrodes extend in the Z-Z' direction through one or more dielectrics of all the dielectrics (one or more of the at least one dielectric) of the base 100. The first TX electrode 300a and the second TX electrode 300b are electrically connected together via the one or more first through-hole electrodes 300d or the one or more first via-hole electrodes (not illustrated). The first TX electrode 300a and the third TX electrode 300c are electrically connected together via the one or more second through-hole electrodes 300e or the one or more second via-hole electrodes. The second TX electrode 300b and the third TX electrode 300c are electrically connected together via the first TX electrode 300a.

The touch sensor S may further include a detection panel (not illustrated), which a detection target, such as a finger or a stylus, may approach. The detection panel may be shaped like a flat plate and located on the Z-direction side relative to the electrode body 210 of the RX electrode 200 and the TX electrode 300. Alternatively, the detection panel may generally have an O shape in a cross-sectional view in the Y-Y' and Z-Z' directions (for example, the detection panel may also serve as a housing of the touch sensor S or the like) and include first, second, third, and fourth portions respectively located on the Z-, Y-, Y'- and Z'-direction sides relative to the electrode body 210 of the RX electrode 200 and the TX electrode 300. In either case, the touch sensor S may further include one or more interposed members. Where one single interposed member is provided, the one interposed member is interposed (sandwiched) between the base 100 and the detection panel. Where the plurality of interposed members is provided, the interposed members are interposed (sandwiched), and stacked together, between the base 100 and the detection panel. The one or more interposed members is only required to be made of a dielectric, constituted by a plastic material, rubber, sponge, cushion, or the like. The one or more interposed members may, but is not required to, have a relative dielectric constant of 2 or larger.

Alternatively, the detection panel may not be provided in the touch sensor S itself, but in an electronic device to be mounted with the touch sensor S. Where the detection panel is shaped like a flat plate, the touch sensor S when mounted on the electronic device is located on the Z'-direction side relative to the detection panel. Where the detection panel is a generally O-shaped casing of an electronic device (e.g., a housing of a door handle of an automobile or the like) to be mounted with the touch sensor S, the touch sensor S when mounted on the electronic device is located on the Z'-direction side relative to the first portion of the detection panel, on the Y-direction side relative to the second portion of the detection panel, on the Y'-direction side relative to the third portion of the detection panel, and on the Z'-direction side relative to the fourth portion of the detection panel. The electronic device may further include the one or more interposed members. With the touch sensor S mounted on the electronic device, the one or more interposed members are interposed between the base 100 of the touch sensor S and the detection panel of the electronic device in a similar manner as described in the preceding paragraph.

The one or more interposed members may be omitted.

The touch sensor S may further include a first wiring 400, a second wiring (not illustrated), and a controller 600. The first wiring 400 is provided at the at least one dielectric of the base 100 and connects the connecting portion of the RX electrode 200 to the controller 600. For convenience of illustration, the controller 600 is illustrated in FIG. 2A only, not in FIGS. 1A to 1C.

Where the at least one dielectric of the base 100 has configuration (1) described above, at least the first conductor 211 and the second conductor 212 of the electrode body 210 of the RX electrode 200 are provided on the first face 111 of the first dielectric 110, the first TX electrode 300*a* is provided on the first face 111 of the first dielectric 110, and the connecting portion of the RX electrode 200 is the through-hole electrode extending in the Z-Z' direction through the first dielectric 110 (not illustrated), in this case the first wiring 400 and the controller 600 may have either of the following configurations (I) or (II). (I) The first wiring 400 includes a first portion 410, a second portion 420, a third portion 430, and a fourth portion 440. The first portion 410 of the first wiring 400 is a conductive line provided on the second face 112 of the first dielectric 110 and connected to the connecting portion of the RX electrode 200. The third portion 430 of the first wiring 400 is a conductive line provided on the first face 111 of the first dielectric 110, and is located on an outer side of (in an area surrounding) the first TX electrode 300*a*. The second portion 420 of the first wiring 400 is a through-hole electrode extending in the Z-Z' direction through the first dielectric 110, and connects the first portion 410 and the third portion 430 of the first wiring 400. The fourth portion 440 of the first wiring 400 is an electrode on the first face 111 of the first dielectric 110. The controller 600 is mounted on the first face 111 of the first dielectric 110 and connected to the fourth portion 440 of the first wiring 400. (II) The first portion 410 of the first wiring 400 is provided in the like manner as configuration (I) above, but the second portion 420, the third portion 430, and the fourth portion 440 of the first wiring 400 are omitted. The controller 600 is mounted on the second face 112 of the first dielectric 110 and connected to the first portion 410 of the first wiring 400.

Where the at least one dielectric of the base 100 has configuration (1) described above, at least the first conductor 211 and the second conductor 212 of the electrode body 210 of the RX electrode 200 are provided on the first face 111 of the first dielectric 110, the connecting portion of the RX electrode 200 is the electrode on the first face 111 of the first dielectric 110, and the first TX electrode 300*a* is provided on the second face 112 of the first dielectric 110 (not illustrated), or alternatively where the at least one dielectric of the base 100 has configuration (1) described above, at least the first conductor 211 and the second conductor 212 of the electrode body 210 of the RX electrode 200 are provided on the first face 111 of the first dielectric 110, the connecting portion of the RX electrode 200 is the electrode on the first face 111 of the first dielectric 110, and the first TX electrode 300*a* is not provided (not illustrated), in either of these cases the first wiring 400 and the controller 600 may have configuration (III) described below or configuration (I) or (II) described above. (III) The first portion 410 of the first wiring 400 is provided on the first face 111 of the first dielectric 110 and connected to the connecting portion of the RX electrode 200. The second portion 420, the third portion 430, and the fourth portion 440 of the first wiring 400 are omitted. The controller 600 is mounted on the first face 111 of the first dielectric 110 and connected to the first portion 410 of the first wiring 400.

Where the at least one dielectric of the base 100 has configuration (2) described above, at least the first conductor 211 and the second conductor 212 of the electrode body 210 of the RX electrode 200 are provided on the first face 111 of the first dielectric 110, and the first TX electrode 300*a* is provided on the first face 111 of the first dielectric 110 (not illustrated), in this case, the connecting portion of the RX electrode 200, the first wiring 400, and the controller 600 may have the following configuration (IV) or (V). (IV) The connecting portion of the RX electrode 200 is the via-hole electrode extending in the Z-Z' direction through the first dielectric 110 or the through-hole electrode extending in the Z-Z' direction through the first dielectric 110 and the second dielectric 120. The first portion 410 of the first wiring 400 is a conductive line on the second face 112 of the first dielectric 110, on the first face 121 of the second dielectric 120, or on the second face 122 of the second dielectric 120, and is connected to the connecting portion of the RX electrode 200. The third portion 430 of the first wiring 400 is a conductive line provided on the first face 111 of the first dielectric 110 and located on an outer side of (in an area surrounding) the first TX electrode 300*a*. The second portion 420 of the first wiring 400 is a via-hole electrode extending in the Z-Z' direction through the first dielectric 110 or a through-hole electrode extending in the Z-Z' direction through the first dielectric 110 and the second dielectric 120, and connects the first portion 410 and the third portion 430 of the first wiring 400. The fourth portion 440 of the first wiring 400 is an electrode on the first face 111 of the first dielectric 110. The controller 600 is mounted on the first face 111 of the first dielectric 110 and connected to the fourth portion 440 of the first wiring 400. (V) The connecting portion of the RX electrode 200 is the through-hole electrode described above. The first portion 410 of the first wiring 400 is a conductive line provided on the second face 122 of the second dielectric 120 and connected to the connecting portion of the RX electrode 200, while the second portion 420, the third portion 430, and the fourth portion 440 of the first wiring 400 are omitted. The controller 600 is mounted on the second face 122 of the second dielectric 120 and connected to the first portion 410 of the first wiring 400.

Where the at least one dielectric of the base 100 has configuration (2) described above, at least the first conductor 211 and the second conductor 212 of the electrode body 210 of the RX electrode 200 are provided on the first face 111 of the first dielectric 110, and the first TX electrode 300*a* is provided on the second face 112 of the first dielectric 110, on the first face 121 of the second dielectric 120, or on the second face 122 of the second dielectric 120 (not illustrated), or alternatively where the at least one dielectric of the base 100 has configuration (2) described above, at least the first conductor 211 and the second conductor 212 of the electrode body 210 of the RX electrode 200 are provided on the first face 111 of the first dielectric 110, and the first TX electrode 300*a* is not provided (not illustrated), in either of these cases, the connecting portion of the RX electrode 200, the first wiring 400 and the controller 600 may have configuration (VI) described below or configuration (IV) or (V) described above. (VI) The connecting portion of the RX electrode 200 is the electrode on the first face 111 of the first dielectric 110. The first portion 410 of the first wiring 400 is provided on the first face 111 of the first dielectric 110 and connected to the connecting portion of the RX electrode 200, while the second portion 420, the third portion 430, and the fourth portion 440 of the first wiring 400 are omitted. The controller 600 is mounted on the first face 111 of the first dielectric 110 and connected to the first portion 410 of the first wiring 400.

Where the at least one dielectric of the base 100 has configuration (3) described above, at least the first conductor 211 and the second conductor 212 of the electrode body 210 of the RX electrode 200 are provided on the first face 111 of the first dielectric 110, and the first TX electrode 300a is provided on the first face 111 of the first dielectric 110, in this case, the connecting portion of the RX electrode 200, the first wiring 400, and the controller 600 may have the following configuration (VII) or (VIII). (VII) The connecting portion of the RX electrode 200 is the via-hole electrode (not illustrated) extending in the Z-Z' direction through the first dielectric 110, the via-hole electrode (not illustrated) extending in the Z-Z' direction through the first dielectric 110 and at least one third dielectric 130 of the one or more third dielectrics 130, or the through-hole electrode (see FIGS. 1A to 2D) extending in the Z-Z' direction through the first dielectric 110, the second dielectric 120, and the one or more third dielectrics 130 (through all the dielectrics). The first portion 410 of the first wiring 400 is a conductive line on the second face 112 of the first dielectric 110 or on the first or second face of one dielectric among the second dielectric 120 and the one or more third dielectrics 130, and is connected to the connecting portion of the RX electrode 200. FIGS. 1A to 2D illustrates an aspect in which, the first portion 410 of the first wiring 400 is provided on the second face 122 of the second dielectric 120. The third portion 430 of the first wiring 400 is a conductive line on the first face 111 of the first dielectric 110, and is located on an outer side of (in an area surrounding) the first TX electrode 300a. The second portion 420 of the first wiring 400 is a via-hole electrode (not illustrated) extending in the Z-Z' direction through the first dielectric 110, a via-hole electrode (not illustrated) extending in the Z-Z' direction through the first dielectric 110 and at least one third dielectric 130 of the one or more third dielectrics 130, or a through-hole electrode (see FIGS. 1A to 2D) extending in the Z-Z' direction through the first dielectric 110, the second dielectric 120, and the one or more third dielectrics 130 (through all the dielectrics), and connects the first portion 410 and the third portion 430 of the first wiring 400. The fourth portion 440 of the first wiring 400 is an electrode on the first face 111 of the first dielectric 110. The controller 600 is mounted on the first face 111 of the first dielectric 110 and connected to the fourth portion 440 of the first wiring 400. (VIII) The connecting portion of the RX electrode 200 is the through-hole electrode described above. The first portion 410 of the first wiring 400 is a conductive line provided on the second face 122 of the second dielectric 120, while the second portion 420, the third portion 430, and the fourth portion 440 of the first wiring 400 are omitted. The controller 600 is mounted on the second face 122 of the second dielectric 120 and connected to the first portion 410 of the first wiring 400.

Where the at least one dielectric of the base 100 has configuration (3) described above, at least the first conductor 211 and the second conductor 212 of the electrode body 210 of the RX electrode 200 are provided on the first face 111 of the first dielectric 110, and the first TX electrode 300a is provided on the second face 112 of the first dielectric 110 or on the first or second face of one dielectric among the second dielectric 120 and the one or more third dielectrics 130 (not illustrated); or alternatively where the at least one dielectric of the base 100 has configuration (3) described above, at least the first conductor 211 and the second conductor 212 of the electrode body 210 of the RX electrode 200 are provided on the first face 111 of the first dielectric 110, and the first TX electrode 300a is not provided (not illustrated), in either of these cases, the connecting portion of the RX electrode 200, the first wiring 400, and the controller 600 may have configuration (IX) described below, or may have configuration (VII) or (VIII) described above. (IX) The connecting portion of the RX electrode 200 is the electrode on the first face 111 of the first dielectric 110. The first portion 410 of the first wiring 400 is provided on the first face 111 of the first dielectric 110 and connected to the connecting portion of the RX electrode 200, while the second portion 420, the third portion 430, and the fourth portion 440 of the first wiring 400 are omitted. The controller 600 is mounted on the first face 111 of the first dielectric 110 and connected to the first portion 410 of the first wiring 400.

The second wiring is provided at the at least one dielectric of the base 100 and connects the TX electrode 300 and the controller 600. The second wiring may have the same configuration the first wirings 400 of any aspect described above, except that the second wiring connects the TX electrode 300 and the controller 600. The first wiring 400 and/or the second wiring may be omitted.

The controller 600 is a logic circuit, such as an IC, and is configured to electrically charge and discharge the RX electrode 200 via the first wiring 400 and to supply drive pulses to the TX electrode 300 via the second wiring (not illustrated).

When the detection target approaches the detection panel (i.e., the electrode body 210 of the RX electrode 200) from the Z-direction side while the controller 600 is electrically charging and discharging the electrode body 210 of the RX electrode 200, the approach causes a change in electrostatic capacitance (self-capacitance) between the detection target and the electrode body 210 of the RX electrode 200. When the controller 600 supplies a drive pulse to the TX electrode 300, the RX electrode 200 and the TX electrode 300 are electrostatically coupled. At this time, the approach of the detection target to the detection panel (i.e., the RX electrode 200 and the TX electrode 300) from the Z-direction side causes a change in electrostatic capacitance (mutual capacitance) between the RX electrode 200 and the TX electrode 300. In accordance with changes in self-capacitance and mutual capacitance, a signal (voltage, current, etc.) of the RX electrode 200 changes.

The controller 600 is further configured to monitor signals (voltage, current, etc.) of the RX electrode 200 and simultaneously compare the signals of the RX electrode 200 with a threshold stored on a memory internal and external to the controller 600 and, when determining by the comparison that the signal of the RX electrode 200 has exceeded the threshold, to detect an approach of the detection target to a portion on the Z-direction side relative to the RX electrode 200 (detect a touch of the detection target, or the like).

The controller 600 can be omitted. Where the controller 600 is omitted, the RX electrode 200 and the TX electrode 300 are electrically connectable to a controller external to the touch sensor S (for example, a controller or the like of an electronic device to be mounted with the touch sensor S (a logic circuit or the like, such as an IC, or software to be processed by a logic circuit or the like)), and the external controller may be configured to control the touch sensor S in any of the above manners in lieu of the controller 600.

The touch sensor S may further include at least one ground conductor. The at least one ground conductor may include at least one of a first ground conductor 500*a* or a second ground conductor 500*b*.

Where the at least one dielectric of the base 100 has configuration (1) described above and the first TX electrode 300*a*, the second TX electrode 300*b*, and the third TX electrode 300*c* have configuration (a) described above, the first ground conductor 500*a* has the following configuration (a1): The first ground conductor 500*a* is provided on the second face 112 of the first dielectric 110 and located between, and in spaced relation to, the second TX electrode 300*b* and the third TX electrode 300*c* (not illustrated). The first ground conductor 500*a* may have a dimension in the Y-Y' direction that is smaller than the distance in the Y-Y' direction between the second TX electrode 300*b* and the third TX electrode 300*c* and is substantially equal to, or larger than, the dimension in the Y-Y' direction of the electrode body 210 of the RX electrode 200. The first ground conductor 500*a* may have a dimension in the X-X' direction that is larger than the dimension in the X-X' direction of the electrode body 210 of the RX electrode 200 and equal to, or smaller than, the dimension in the X-X' direction of each of the second TX electrode 300*b* and the third TX electrode 300*c*. The first ground conductor 500*a* is located on the Z'-direction side relative to the electrode body 210 of the RX electrode 200 such as to overlap the electrode body 210 of the RX electrode 200. In this case, the second ground conductor 500*b* is omitted.

Where the at least one dielectric of the base 100 has configuration (1) described above and the first TX electrode 300*a*, the second TX electrode 300*b*, and the third TX electrode 300*c* have configuration (b) described above, the first ground conductor 500*a* has the following configuration (b1): The first ground conductor 500*a* is provided on the second face 112 of the first dielectric 110 and located within the first opening 301*a* of the first TX electrode 300*a*, in spaced relation to a peripheral edge of the first opening 301*a*. The first ground conductor 500*a* may have a dimension in the Y-Y' direction that is smaller than the dimension in the Y-Y' direction of the first opening 301*a* of the first TX electrode 300*a* and is substantially equal to, or larger than, the dimension in the Y-Y' direction of the electrode body 210 of the RX electrode 200. The first ground conductor 500*a* may have a dimension in the X-X' direction that is smaller than the dimension in the X-X' direction of the first opening 301*a* of the first TX electrode 300*a* and substantially equal to, or larger than, the dimension in the X-X' of the electrode body 210 of the RX electrode 200. The first ground conductor 500*a* is located on the Z'-direction side relative to the electrode body 210 of the RX electrode 200 such as to overlap the electrode body 210 of the RX electrode 200. In this case, the second ground conductor 500*b* is omitted.

Where the at least one dielectric of the base 100 has configuration (2) described above and the first TX electrode 300*a*, the second TX electrode 300*b*, and the third TX electrode 300*c* have one of configurations (c) to (h) described above, the first ground conductor 500*a* and the second ground conductor 500*b* may have the following configurations. The first ground conductor 500*a* is provided on a face that is among the second face 112 of the first dielectric 110, the first face 121 of the second dielectric 120, and the second face 122 of the second dielectric 120 and that is provided with the second TX electrode 300*b* and the third TX electrode 300*c*, are located between, and in spaced relation to, the second TX electrode 300*b* and the third TX electrode 300*c*; or alternatively the first ground conductor 500*a* is provided on a face that is among the second face 112 of the first dielectric 110, the first face 121 of the second dielectric 120, the second face 122 of the second dielectric 120, the first face 131 of the single third dielectric 130 or one of the first faces 131 of the third dielectrics 130, and the second face 132 of the single third dielectric 130 or one of the second faces 132 of the third dielectrics 130, and that is provided with the first TX electrode 300*a*, and is located within the first opening 301*a* of the first TX electrode 300*a*, in spaced relation to the peripheral edge of the first opening 301*a*. Where the first ground conductor 500*a* is located between, and in spaced relation to, the second TX electrode 300*b* and the third TX electrode 300*c*, the first ground conductor 500*a* has the dimensions in the Y-Y' and X-X' directions as described for configuration (a1) above, and the first ground conductor 500*a* is located on the Z'-direction side relative to the electrode body 210 of the RX electrode 200 such as to overlap the electrode body 210 of the RX electrode 200. Where the first ground conductor 500*a* is located within the first opening 301*a* of the first TX electrode 300*a* in spaced relation to the peripheral edge of the first opening 301*a*, the first ground conductor 500*a* has the dimensions in the Y-Y' and X-X' directions as described for configuration (b1) above, and the first ground conductor 500*a* is located on the Z'-direction side relative to the electrode body 210 of the RX electrode 200. Where there is another face or other faces that are among the second face 112 of the first dielectric 110, the first face 121 of the second dielectric 120, and the second face 122 of the second dielectric 120 and that are different from the face provided with the first TX electrode 300*a* and the face provided with the second TX electrode 300*b* and the third TX electrode 300*c*, the second ground conductor 500*b* is provided on the another face or one of the other faces. The second ground conductor 500*b* may have a dimension in the Y-Y' direction that is equal to, or larger than, the dimension in the Y-Y' direction of the first TX electrode 300*a*, and/or substantially equal to, or larger than, the distance in the Y-Y' direction from an end on the Y-direction side of the second TX electrode 300*b* to an end on the Y'-direction side of the third TX electrode 300*c*. The second ground conductor 500*b* may have a dimension in the X-X' direction that is equal to, or larger than, the dimension in the X-X' direction of the first TX electrode 300*a* and/or substantially equal to, or larger than, the distance in the X-X' direction from an end on the X-direction side of the second TX electrode 300*b* to an end on the X'-direction side of the second TX electrode 300*b*. The second ground conductor 500*b* is located in the Z-Z' direction such as to overlap the electrode body 210 of the RX electrode 200, the first TX electrode 300*a*, the second TX electrode 300*b*, and the third TX electrode 300*c*. Where the another face or other faces do not exist that are among the second face 112 of the first dielectric 110, the first face 121 of the second dielectric 120, and the second face 122 of the second dielectric 120 and that are different from the face provided with the first TX electrode 300*a* and the face provided with the second TX electrode 300*b* and the third TX electrode 300*c*, the second ground conductor 500*b* is omitted.

Where the at least one dielectric of the base 100 has configuration (3) described above and the first TX electrode 300*a*, the second TX electrode 300*b*, and the third TX electrode 300*c* have one of configurations (i) to (1) described above, the first ground conductor 500*a* and the second ground conductor 500b may have the following configurations. The first ground conductor 500a is provided on a face that is among the second face 112 of the first dielectric 110, the first face 121 of the second dielectric 120, the second face 122 of the second dielectric 120, the first face 131 of the single third dielectric 130 or one of the first faces 131 of the third dielectrics 130, and the second face 132 of the single third dielectric 130 or one of the second faces 132 of the third dielectrics 130 and that is provided with the second TX electrode 300b and the third TX electrode 300c, and located between, and in spaced relation to, the second TX electrode 300b and the third TX electrode 300c. Alternatively, the first ground conductor 500a is provided on a face that is among the second face 112 of the first dielectric 110, the first face 121 of the second dielectric 120, the second face 122 of the second dielectric 120, the first face 131 of the single third dielectric 130 or one of the first face 131 of the third dielectrics 130, and the second face 132 of the single third dielectric 130 or one of the second faces 132 of the third dielectrics 130 and that is provided with the first TX electrode 300a, and located within the first opening 301a of the first TX electrode 300a, in spaced relation to the peripheral edge of the first opening 301a. Where the first ground conductor 500a is located between, and in spaced relation to, the second TX electrode 300b and the third TX electrode 300c, the first ground conductor 500a has the dimensions in the Y-Y' and X-X' directions as described for configuration (a1), and the first ground conductor 500a is located on the Z'-direction side relative to the electrode body 210 of the RX electrode 200 such as to overlap the electrode body 210 of the RX electrode 200. Where the first ground conductor 500a is located within the first opening 301a of the first TX electrode 300a in spaced relation to the peripheral edge of the first opening 301a, the first ground conductor 500a has the dimensions in the Y-Y' and X-X' directions as described for configuration (b1) above, and the first ground conductor 500a is located on the Z'-direction side relative to the electrode body 210 of the RX electrode 200 such as to overlap the electrode body 210 of the RX electrode 200. Where there is another face or other faces that are among the second face 112 of the first dielectric 110, the first face 121 of the second dielectric 120, the second face 122 of the second dielectric 120, the first face 131 of the single third dielectric 130 or one of the first face 131 of the third dielectrics 130, and the second face 132 of the single third dielectric 130 or one of the second faces 132 of the third dielectrics 130, and that is different from the face provided with the first TX electrode 300a and the face provided with the second TX electrode 300b and the third TX electrode 300c, the second ground conductor 500b is provided on the another face or one of the other faces. The second ground conductor 500b has the dimensions in the Y-Y' and X-X' directions as described in the preceding paragraph. The second ground conductor 500b is located in the Z-Z' direction such as to overlap the electrode body 210 of the RX electrode 200, the first TX electrode 300a, the second TX electrode 300b, and the third TX electrode 300c. Where the another face or other faces do not exist that are among the second face 112 of the first dielectric 110, the first face 121 of the second dielectric 120, the second face 122 of the second dielectric 120, the first face 131 of the single third dielectric 130 or one of the first faces 131 of the one or more third dielectrics 130, and the second face 132 of the single third dielectric 130 or one of the second faces 132 of the third dielectrics 130, and that is different from the face provided with the first TX electrode 300a and the face provided with the second TX electrode 300b and the third TX electrode 300c, the second ground conductor 500b is omitted.

Where the second ground conductor 500b is located in the Z-Z' direction between the first TX electrode 300a and the combination of the second TX electrode 300b and the third TX electrode 300c, the second ground conductor 500b is provided with one or more first openings 501b, which serve to avoid interference of the second ground conductor 500b with the one or more first through-hole electrodes 300d or the one or more first via-hole electrodes, and one or more second openings 502b, which serve to avoid interference of the second ground conductor 500b with the one or more second through-hole electrodes 300e or the one or more second via-hole electrodes. Where the connecting portion of the RX electrode 200 is the through-hole or the via-hole electrode, the first ground conductor 500a is provided with a third opening 501a, which serves to avoid interference of the first ground conductor 500a with the connecting portion, and the second ground conductor 500b is provided with a third opening 503b, which serves to avoid interference of the second ground conductor 500b with the connecting portion.

Where there are provided both the first ground conductor 500a and the second ground conductor 500b, the at least one ground conductor further includes one or more third through-hole electrodes 500c, which extend in the Z-Z' direction through all the dielectrics (the at least one dielectric) of the base 100, or one or more third via-hole electrodes (not illustrated), which extend in the Z-Z' direction through one or more dielectrics of all the dielectrics (one or more of the at least one dielectric) of the base 100. The first ground conductor 500a and the second ground conductor 500b are electrically connected to each other via the one or more third through-hole electrodes 500c or the one or more third via-hole electrodes. The first TX electrode 300a is provided with one or more second openings 302a, which serve to avoid interference of the first TX electrode 300a with the one or more third through-hole electrodes 500c or the one or more third via-hole electrodes.

The at least one ground conductor can be omitted.

A noise reduction method according to an embodiment of the invention will now be described in detail. This method is a method of suppressing external noise (immunity noise) that would otherwise be applied to the RX electrode 200 according to any of the above aspects. As described above, the RX electrode 200 is shaped like a loop antenna, and the first conductor 211 and the second conductor 212 extend in the X-X' direction and are located close to each other with the gap G therebetween, so that a strong Coulomb force is generated between the first conductor 211 and the second conductor 212. With such Coulomb force, application of external noise to the electrode body 210 of the RX electrode 200 induces current flows in opposite directions through the first conductor 211 and the second conductor 212, so that an electric field generated in the first conductor 211 and an electric field generated in the second conductor 212 offset each other. As a result, the RX electrode 200 has poor radiation efficiency as a loop antenna. As such poor radiation efficiency also means poor reception efficiency, the RX electrode 200 is shaped such as to have poor reception efficiency as a loop antenna, so that the RX electrode 200 is less susceptible to external noise. It should be noted that the RX electrode 200, although having poor reception efficiency as an antenna, will not be used as an antenna. The controller 600 or an external controller can detect an approach of the detection target (a touch of the detection target, or the like) by monitoring signals (voltage, current, etc.) of the RX electrode 200 and simultaneously comparing the signals of the RX electrode 200 with the threshold as described above.

Where the touch sensor S is configured such that the first TX electrodes 300a surrounds the electrode body 210 of the RX electrode 200 with a space therebetween on one and the same face of the at least one dielectric, the first TX electrodes 300a function as a guard ring for the electrode body 210 of the RX electrode 200. The electrode body 210 of the RX electrode 200 thus has improved resistance to external noise (improved EMC resistance). Alternatively, also where the second TX electrode 300b and the third TX electrode 300c are located on opposite sides of the electrode body 210 of the RX electrode 200 on one and the same face of the at least one dielectric, the electrode body 210 of the RX electrode 200 has improved resistance to external noise (improved EMC resistance).

In a touch sensor of a comparative example in which the TX electrode 300 is not provided and the second ground conductor 500b is located on the Z'-direction side relative to the electrode body 210 of the RX electrode 200, in order to improve the electrode body 210 of the RX electrode 200 in terms of the resistance to external noise (in terms of EMC resistance), the second ground conductor 500b should be located near the electrode body 210 of the RX electrode 200. While the electrode body 210 of the RX electrode 200 is being electrically charged and discharged, if a conductor deposit, such as water, becomes attached to the first and second portions of the generally O-shaped detection panel, or alternatively the first and third portions of the detection panel, such as to extend across the electrode body 210 of the RX electrode 200 and the second ground conductor 500b, the attachment of the conductor deposit causes increase of self-capacitance of the electrode body 210 of the RX electrode 200 by an amount of change ΔC1.

This is in contrast with the touch sensor S in which the first TX electrodes 300a surrounds the electrode body 210 of the RX electrode 200 with a space therebetween on one and the same face of the at least one dielectric, and the second ground conductor 500b is located on the Z'-direction side relative to the electrode body 210 of the RX electrode 200. As described above, the electrode body 210 of the RX electrode 200 has improved resistance to external noise (EMC resistance) because of the first TX electrode 300a, making it possible to locate the second ground conductor 500b away from the electrode body 210 of the RX electrode 200. While the electrode body 210 of the RX electrode 200 is being electrically charged and discharged and drive pulses are being supplied to the first TX electrode 300a, if the conductor deposit becomes attached to the first and second portions of the generally O-shaped detection panel, or alternatively to the first and third portions of the detection panel, such as to extend across the electrode body 210 of the RX electrode 200, the first TX electrode 300a, and the second ground conductor 500b, the attachment of the conductor deposit causes increase of self-capacitance of the electrode body 210 of the RX electrode 200 by an amount of change ΔC2. However, the amount of change ΔC2 is smaller than the amount of change ΔC1, which means suppressed increase of the self-capacitance of the electrode body 210 of the RX electrode 200 caused by the attachment of the conductor deposit in the touch sensor S, as compared with the touch sensor of the comparative example. In other words, since the touch sensor S is configured to suppress changes in signals (voltage, current, etc.) of the RX electrode 200 according to changes in self-capacitance and mutual capacitance at the time of attachment of the conductor deposit. It is therefore possible to reduce the possibility that the attachment of the conductor deposit causes the controller 600 or the external controller to erroneously detects that a signal (voltage, current, etc.) of the RX electrode 200 has exceeded the threshold.

Where the touch sensor S is configured such that the first TX electrodes 300a surrounds the electrode body 210 of the RX electrode 200 with a space therebetween on one and the same face of the at least one dielectric, the second TX electrode 300b and the third TX electrode 300c are provided on another face of the at least one dielectric that is on the Z'-direction side relative to the face provided with the electrode body 210 of the RX electrode 200 and the first TX electrode 300a, and the first ground conductor 500a is provided between the second TX electrode 300b and the third TX electrode 300c on the another face on the Z'-direction side (of note, it does not matter whether the second ground conductor 500b is provided), as described above, the electrode body 210 of the RX electrode 200 has improved resistance to external noise (EMC resistance) because of the first TX electrode 300a, making it possible to locate the first ground conductor 500a away from the electrode body 210 of the RX electrode 200. While the electrode body 210 of the RX electrode 200 is being electrically charged and discharged and drive pulses are being supplied to the first TX electrode 300a, if the conductor deposit becomes attached to the first, second, and fourth portions of the generally O-shaped detection panel, or alternatively to the first, third, and fourth portions of the detection panel, such as to extend across the electrode body 210 of the RX electrode 200, the TX electrode 300, and the first ground conductor 500a, the attachment of the conductor deposit causes increase of self-capacitance of the electrode body 210 of the RX electrode 200 by an amount of change ΔC3. However, the amount of change ΔC3 is smaller than the amount of change ΔC1, which means suppressed increase of the self-capacitance of the electrode body 210 of the RX electrode 200 caused by the attachment of the conductor deposit in the touch sensor S, as compared with the touch sensor of the comparative example. In other words, since the touch sensor S is configured to suppress changes in signals (voltage, current, etc.) of the RX electrode 200 according to changes in self-capacitance and mutual capacitance at the time of attachment of the conductor deposit. It is therefore possible to reduce the possibility that the attachment of the conductor deposit causes the controller 600 or the external controller to erroneously detects that a signal (voltage, current, etc.) of the RX electrode 200 has exceeded the threshold.

Where the touch sensor S is configured such that the first TX electrodes 300a surrounds the electrode body 210 of the RX electrode 200 with a space therebetween on one and the same face of the at least one dielectric, the second ground conductor 500b is located on the Z'-direction side relative to the electrode body 210 of the RX electrode 200, a constant distance (a first distance) is provided between the outer end 211d of the first conductor 211 of the electrode body 210 of the RX electrode 200 and the Y-direction side end of the second ground conductor 500b is constant, and a constant distance (a second distance) is provided between the outer end 212d of the second conductor 212 of the electrode body 210 of the RX electrode 200 and the Y'-direction side end of the second ground conductor 500b, the first conductor 310a of the first TX electrode 300a is located between the outer end 211d of the first conductor 211 of the electrode body 210 of the RX electrode 200 and the Y-direction side end of the second ground conductor 500b in the stroke of the first distance. The second conductor 320a of the first TX electrode 300a is located between the outer end 212d of the second conductor 212 of the electrode body 210 of the RX electrode 200 and the Y'-direction side end of the second ground conductor 500b in the stroke of the second distance.

Note that the first distance is a sum of a linear distance in the Y-Y' direction from the outer end 211d of the first conductor 211 of the electrode body 210 of the RX electrode 200 to the Y-direction side end of the face provided with the RX electrode 200 of the at least one dielectric, a linear distance in the Z-Z' direction from the Y-direction side end of the face provided with the RX electrode 200 of the at least one dielectric to the Y-direction side end of the face provided with the second ground conductor 500b of the at least one dielectric, and a linear distance in the Y-Y' direction from the Y-direction side end of the face provided with the second ground conductor 500b of the at least one dielectric to the Y-direction side end of the second ground conductor 500b. The second distance is a sum of a linear distance in the Y-Y' direction from the outer end 212d of the second conductor 212 of the electrode body 210 of the RX electrode 200 to the Y'-direction side end of the face provided with the RX electrode 200 of the at least one dielectric, a linear distance in the Z-Z' direction from the Y'-direction side end of the face provided with the RX electrode 200 of the at least one dielectric to the Y'-direction side end of the face provided with the second ground conductor 500b of the at least one dielectric, and a linear distance in the Y-Y' direction from the Y'-direction side end of the face provided with the second ground conductor 500b of the at least one dielectric to the Y'-direction side end of the second ground conductor 500b.

In the touch sensor S with such a configuration, while the electrode body 210 of the RX electrode 200 is being electrically charged and discharged and drive pulses are being supplied to the first TX electrode 300a, if the conductor deposit becomes attached to the first and second portions of the generally O-shaped detection panel, or alternatively to the first and third portions of the detection panel, such as to extend across the electrode body 210 of the RX electrode 200, the first TX electrode 300a, and the second ground conductor 500b, the attachment of the conductor deposit causes increase of self-capacitance of the electrode body 210 of the RX electrode 200 by an amount of change ΔC2, and also causes increase of mutual capacitance between the first TX electrode 300a and the electrode body 210 of the RX electrode 200 by the electrostatic capacitance of the conductor deposit because the conductor deposit electrically floats from earth ground. At this time, a change in a signal (voltage, current, etc.) of the RX electrode 200 in accordance with the change in self-capacitance and a change in the signal (voltage, current, etc.) of the RX electrode 200 in accordance with the change in mutual capacitance offset each other at least partially, suppressing the change of the signal (voltage, current, etc.) of the RX electrode 200 in accordance with changes in self-capacitance and mutual capacitance caused by the attachment of the conductor deposit. It is therefore possible to reduce the possibility that the attachment of the conductor deposit causes the controller 600 or the external controller to erroneously detects that a signal (voltage, current, etc.) of the RX electrode 200 has exceeded the threshold. On the other hand, while the electrode body 210 of the RX electrode 200 is being electrically charged and discharged and drive pulses are being supplied to the first TX electrode 300a, if the detection target approaches the first and second portions of the generally O-shaped detection panel, or alternatively to the first and third portions of the detection panel, with the detection target extending over the electrode body 210 of the RX electrode 200, the first TX electrode 300a, and the second ground conductor 500b, the approach of the detection target causes increase of self-capacitance of the electrode body 210 of the RX electrode 200 by an amount of change ΔC4, but mutual capacitance between the first TX electrode 300a and the electrode body 210 of the RX electrode 200 decreases because some electrical charge escapes from the mutual capacitance to earth ground through the detection target. At this time, a change in a signal (voltage, current, etc.) of the RX electrode 200 according to the change in the self-capacitance and a change in the signal (voltage, current, etc.) of the RX electrode 200 according to the change in the mutual capacitance offset each other partially but to a lesser degree at the time of the approach of the detection target, as compared to the offset at the time of the attachment of the conductor deposit. In other words, the change in the signal (voltage, current, etc.) of the RX electrode 200 according to the changes in the self-capacitance and the mutual capacitance caused by the approach of the detection target is larger than the change in the signal (voltage, current, etc.) of the RX electrode 200 according to the change in the self-capacitance and the mutual capacitance at the time of attachment of the conductor deposit. As such, the controller 600 or the external controller is able to detect the approach of the detection target as the signal (voltage, current, etc.) of the RX electrode 200 exceeding the threshold.

where the touch sensor S is configured such that the first TX electrodes 300a surrounds the electrode body 210 of the RX electrode 200 with a space therebetween on one and the same face of the at least one dielectric, the second TX electrode 300b and the third TX electrode 300c are provided on another face of the at least one dielectric that is on the Z'-direction side relative to the face provided with the electrode body 210 of the RX electrode 200 and the first TX electrode 300a, the first ground conductor 500a is provided between the second TX electrode 300b and the third TX electrode 300c on the face on the Z'-direction side, a constant distance (a third distance) is provided between the outer end 211d of the first conductor 211 of the electrode body 210 of the RX electrode 200 and the Y-direction side end of the first ground conductor 500a, and a constant distance (a fourth distance) is provided between the outer end 212d of the second conductor 212 of the electrode body 210 of the RX electrode 200 and the Y'-direction side end of the first ground conductor 500a, the first conductor 310a of the first TX electrode 300a and the second TX electrode 300b are located between the outer end 211d of the first conductor 211 of the electrode body 210 of the RX electrode 200 and the Y-direction side end of the first ground conductor 500a in the stroke of the third distance. The second conductor 320a of the first TX electrode 300a and the third TX electrode 300c are located between the outer end 212d of the second conductor 212 of the electrode body 210 of the RX electrode 200 and the Y'-direction side end of the first ground conductor 500a in the stroke of the fourth distance.

Note that the third distance is a sum of a linear distance in the Y-Y' direction from the outer end 211d of the first conductor 211 of the electrode body 210 of the RX electrode 200 to the Y-direction side end of the face provided with the RX electrode 200 of the at least one dielectric, a linear distance in the Z-Z' direction from the Y-direction side end of the face provided with the RX electrode 200 of the at least one dielectric to the Y-direction side end of the face provided with the first ground conductor 500a of the at least one dielectric, and a linear distance in the Y-Y' direction from the Y-direction side end of the face provided with the first ground conductor 500a of the at least one dielectric to the Y-direction side end of the first ground conductor 500a. The fourth distance is a sum of a linear distance in the Y-Y' direction from the outer end 212*d* of the second conductor 212 of the electrode body 210 of the RX electrode 200 to the Y'-direction side end of the face provided with the RX electrode 200 of the at least one dielectric, a linear distance in the Z-Z' direction from the Y'-direction side end of the face provided with the RX electrode 200 of the at least one dielectric to the Y'-direction side end of the face provided with the first ground conductor 500*a* of the at least one dielectric, and a linear distance in the Y-Y' direction from the Y'-direction side end of the face provided with the first ground conductor 500*a* of the at least one dielectric to the Y'-direction side end of the first ground conductor 500*a*.

In the touch sensor S with such a configuration, while the electrode body 210 of the RX electrode 200 is being electrically charged and discharged and drive pulses are being supplied to the TX electrode 300, if the conductor deposit becomes attached to the first, second, and fourth portions of the detection panel, or alternatively to the first, third, and fourth portions of the detection panel, such as to extend across the electrode body 210 of the RX electrode 200, the TX electrode 300, and the first ground conductor 500*a*, the attachment of the conductor deposit causes increase of self-capacitance of the electrode body 210 of the RX electrode 200 by an amount of change ΔC3, and also causes increase of mutual capacitance between the TX electrode 300 and the electrode body 210 of the RX electrode 200 by the electrostatic capacitance of the conductor deposit because the conductor deposit electrically floats from earth ground. At this time, a change in a signal (voltage, current, etc.) of the RX electrode 200 in accordance with the change in self-capacitance and a change in the signal (voltage, current, etc.) of the RX electrode 200 in accordance with the change in mutual capacitance are offset each other at least partially, suppressing the change of the signal (voltage, current, etc.) of the RX electrode 200 in accordance with changes in self-capacitance and mutual capacitance caused by the attachment of the conductor deposit. It is therefore possible to reduce the possibility that the attachment of the conductor deposit causes the controller 600 or the external controller to erroneously detects that a signal (voltage, current, etc.) of the RX electrode 200 has exceeded the threshold. On the other hand, while the electrode body 210 of the RX electrode 200 is being electrically charged and discharged and drive pulses are being supplied to the TX electrode 300, if the detection target approaches the first, second, and fourth portions of the detection panel, or alternatively to the first, third, and fourth portions of the detection panel, with the detection target extending over and across the electrode body 210 of the RX electrode 200, the TX electrode 300, and the first ground conductor 500*a*, the approach of the detection target causes increase of self-capacitance of the electrode body 210 of the RX electrode 200 by an amount of change ΔC5, but mutual capacitance between the TX electrode 300 and the electrode body 210 of the RX electrode 200 decreases because some electrical charge escapes from the mutual capacitance to earth ground through the detection target. At this time, a change in a signal (voltage, current, etc.) of the RX electrode 200 according to the change in the self-capacitance and a change in the signal (voltage, current, etc.) of the RX electrode 200 according to the change in the mutual capacitance offset each other partially but to a lesser degree at the time of the approach of the detection target, as compared to the offset at the time of the attachment of the conductor deposit. In other words, the change in the signal (voltage, current, etc.) of the RX electrode 200 according to the changes in the self-capacitance and the mutual capacitance caused by the approach of the detection target is larger than the change in the signal (voltage, current, etc.) of the RX electrode 200 according to the change in the self-capacitance and the mutual capacitance at the time of attachment of the conductor deposit. As such, the controller 600 or the external controller is able to detect the approach of the detection target as the signal (voltage, current, etc.) of the RX electrode 200 exceeding the threshold.

Where the touch sensor S is configured such that the first TX electrodes 300*a* surrounds the electrode body 210 of the RX electrode 200 with a space therebetween on one and the same face of the at least one dielectric and the detection panel is a housing of a door handle of an automobile, the door itself of the automobile is at the same potential as the ground, the first conductor 310*a* of the first TX electrode 300*a* is located between the first conductor 211 of the electrode body 210 of the RX electrode 200 and the door, and the second conductor 320*a* of the first TX electrode 300*a* is located between the second conductor 212 of the electrode body 210 of the RX electrode 200 and the door. In this case, if the conductor deposit becomes attached to the door handle and the door such as to extend across the electrode body 210 of the RX electrode 200, the first TX electrode 300*a*, and the door, as described above, the attachment of the conductor deposit causes increase of self-capacitance of the electrode body 210 of the RX electrode 200 and the mutual capacitance between the first TX electrode 300*a* and the electrode body 210 of the RX electrode 200, and a change in a signal (voltage, current, etc.) of the RX electrode 200 in accordance with the change in self-capacitance and a change in the signal (voltage, current, etc.) of the RX electrode 200 in accordance with the change in mutual capacitance offset each other at least partially. This suppresses the change of the signal (voltage, current, etc.) of the RX electrode 200 in accordance with changes in self-capacitance and mutual capacitance caused by the attachment of the conductor deposit. It is therefore possible to reduce the possibility that the attachment of the conductor deposit causes the controller 600 or the external controller to erroneously detects that a signal (voltage, current, etc.) of the RX electrode 200 has exceeded the threshold.

Here, first to fourth simulations were performed as described below. S-parameters (S11) of the first to fourth simulations were analyzed under the following conditions using an electromagnetic (EM) simulator (Ansys HFSS from Ansys).

[Conditions of first simulation] CAD data of the touch sensor S of the first embodiment as illustrated in FIGS. 1A to 2D were input to the EM simulator. On the basis of the CAD data, a first model was created using the EM simulator.

The touch sensor S in the first model, as illustrated in FIGS. 1A to 2D, includes the base 100, the RX electrode 200, the TX electrode 300, the first wiring 400, the first ground conductor 500*a*, and the second ground conductor 500*b*. The first model is provided with neither a second wiring nor a controller 600.

The base 100 includes the first dielectric 110, the second dielectric 120, and the single third dielectric 130 stacked together in the Z-Z' direction. The third dielectric 130 is located between the first dielectric 110 and the second dielectric 120. The first dielectric 110 has a dimension in the Z-Z' direction of 0.1 mm, the second dielectric 120 has a dimension in the Z-Z' direction of 0.1 mm, and the third dielectric 130 has a dimension in the Z-Z' direction of 0.6 mm.

The electrode body 210 of the RX electrode 200 and the first TX electrode 300a of the TX electrode 300 are provided on the first face 111 of the first dielectric 110 as illustrated in FIGS. 1A and 2A. the electrode body 210 of the RX electrode 200 has a dimension in the Y-Y' direction of 6.5 mm, a dimension in the X-X' direction of 41.15 mm, and a dimension in the Z-Z' direction of 0.051 mm.

The electrode body 210 of the RX electrode 200 includes the generally rectangular first conductor 211, the generally rectangular second conductor 212, the third conductor 213, and the fourth conductor 214. The first conductor 211 and the second conductor 212 are rectangular conductors extending in the X-X' direction and are located close to each other in the Y-Y' direction with a gap G therebetween. The distance (dimension of the gap G) in the Y-Y' direction between the inner end 211c of the first conductor 211 and the inner end 212c of the second conductor 212 is a constant distance of 0.2 mm. Each of the first conductor 211 and the second conductor 212 has a dimension in the Y-Y' direction of 3.15 mm and a dimension in the X-X' direction of 41.15 mm. The third conductor 213 extends in a straight line in the Y-Y' direction from the first end portion 211a of the first conductor 211 to the first end portion 212a of the second conductor 212, and is located on the X-direction side relative to the gap G between the first conductor 211 and the second conductor 212. The third conductor 213 has a dimension in the Y-Y' direction of 0.2 mm and a dimension in the X-X' direction of 0.25 mm. The fourth conductor 214 of the RX electrode 200 is the through-hole electrode extending in the Z-Z' direction through the first dielectric 110, the second dielectric 120, and the third dielectric 130, and doubles as the connecting portion. The fourth conductor 214 of the RX electrode 200 is connected to the corner on the Y'-direction side of a second end portion 211b of the first conductor 211 and the corner on the Y-direction side of a second end portion 212b of the second conductor 212, and is located on the X'-direction side relative to the gap G between the first conductor 211 and the second conductor 212. The fourth conductor 214 is located such as to partly protrude relative to the end on the X'-direction side of the second end portion 211b of the first conductor 211 and relative to the end on the X'-direction side of the second end portion 212b of the second conductor 212.

The first TX electrode 300a has a generally square ring shape surrounding the electrode body 210 of the RX electrode 200. The first conductor 310a of the first TX electrode 300a has a generally rectangular shape extending in the X-X' direction and is located in spaced relation to, and on the Y-direction side relative to, the first conductor 211 of the RX electrode 200. The second conductor 320a of the first TX electrode 300a has a generally rectangular shape extending in the X-X' direction and is located in spaced relation to, and on the Y'-direction side relative to, the second conductor 212 of the RX electrode 200. The third conductor 330a of the first TX electrode 300a has a generally rectangular shape extending in the Y-Y' direction from the first end portion of the first conductor 310a of the first TX electrode 300a to the first end portion of the second conductor 320a of the first TX electrode 300a and is located in spaced relation to, and on the X-direction side relative to, the electrode body 210 of the RX electrode 200. The fourth conductor 340a of the first TX electrode 300a has a generally rectangular shape extending in the Y-Y' direction from the second end portion of the first conductor 310a of the first TX electrode 300a to the second end portion of the second conductor 320a of the first TX electrode 300a and is located in spaced relation to, and on the X'-direction side relative to, the electrode body 210 of the RX electrode 200. The fourth conductor 340a of the first TX electrode 300a is provided with the recess 341a recessed to the X'-direction side.

The first TX electrode 300a a dimension in the Y-Y' direction of 11 mm, a dimension in the X-X' direction of 62.527 mm, and a dimension in the Z-Z' direction of 0.051 mm. A distance in the Y-Y' direction between the first conductor 211 of the electrode body 210 of the RX electrode 200 and the first conductor 310a of the first TX electrode 300a is 1 mm, and a distance in the Y-Y' direction between the second conductor 212 of the electrode body 210 of the RX electrode 200 and the second conductor 320a of the first TX electrode 300a is also 1 mm. A distance in the X-X' direction between the electrode body 210 of the RX electrode 200 and the third conductor 330a of the first TX electrode 300a is 1 mm, and a distance in the X-X' direction between the electrode body 210 of the RX electrode 200 and the fourth conductor 340a of the first TX electrode 300a is also 1 mm.

Figure 2C:
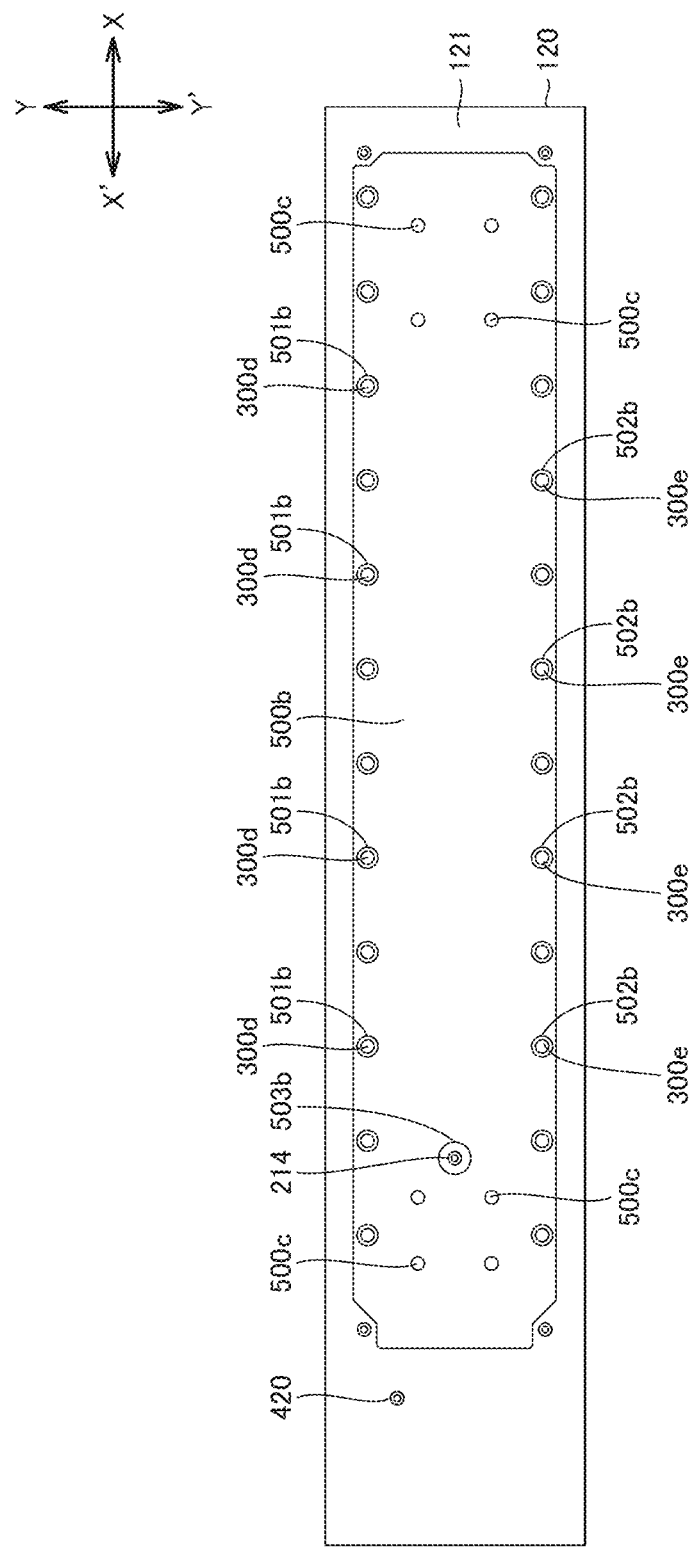
FIG. 2C is a schematic plan view of a second dielectric of the base of the touch sensor of the first embodiment.
Figure 2D:
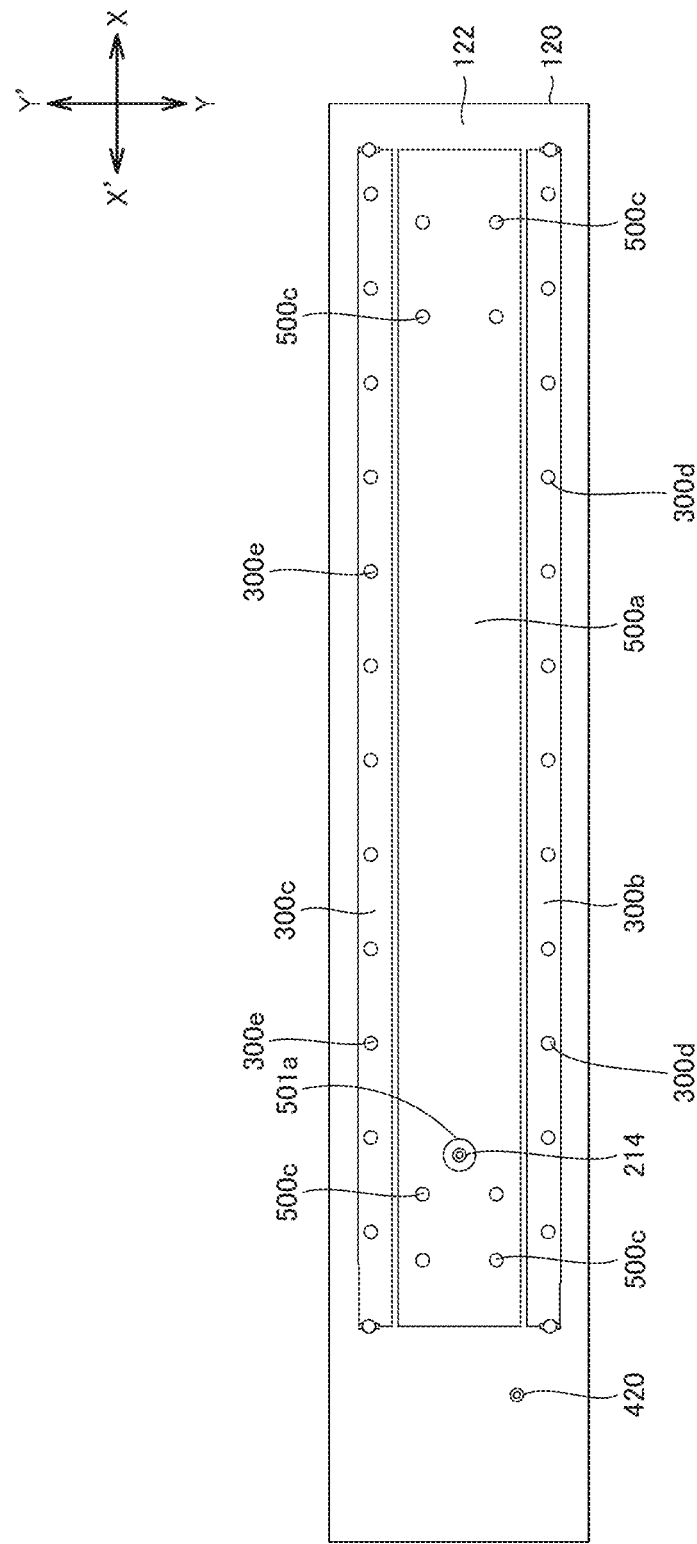
FIG. 2D is a schematic bottom view of the second dielectric of the base of the touch sensor of the first embodiment.

As illustrated in FIG. 2D, the second TX electrode 300b of the TX electrode 300 has a generally rectangular shape, is provided on the second face 122 of the second dielectric 120, and is located in spaced relation to, and on the Y-direction side relative to, the first conductor 211 of the RX electrode 200. As illustrated in FIG. 2D, the third TX electrode 300c of the TX electrode 300 has a generally rectangular shape, is provided on the second face 122 of the second dielectric 120, and is located in spaced relation to, and on the Y'-direction side relative to, the second conductor 212 of the RX electrode 200. Each of the second TX electrode 300b and the third TX electrode 300c a dimension in the Y-Y' direction of 2.05 mm and a dimension in the X-X' direction that is equal to the dimension in the X-X' direction of the first TX electrode 300a.

The first TX electrode 300a and the second TX electrode 300b are connected by the first through-hole electrodes 300d (there are twelve of them), and the first TX electrode 300a and the third TX electrode 300c are connected by the second through-hole electrodes 300e (there are twelve of them). The twelve first through-hole electrodes 300d are equidistantly spaced in the X-X' direction, and the twelve second through-hole electrodes 300e are also equidistantly spaced in the X-X' direction.

The first ground conductor 500a has a generally rectangular shape, and is located between, and in spaced relation to, the second TX electrode 300b and the third TX electrode 300c on the second face 122 of the second dielectric 120. The first ground conductor 500a is located on the Z'-direction side relative to the electrode body 210 of the RX electrode 200 such as to overlap the electrode body 210 of the RX electrode 200. The first ground conductor 500a is provided with the third opening 501a, which serve to avoid interference with the fourth conductor 214 of the RX electrode 200.

The first ground conductor 500a has a dimension in the Y-Y' direction of 6.5 m, and a dimension in the X-X' direction that is equal to the dimension in the X-X' direction of each of the second TX electrode 300b and the third TX electrode 300c. The first ground conductor 500a has a dimension in the Z-Z' direction of 0.051 mm. A distance in the Y-Y' direction between the first ground conductor 500a and the second TX electrode 300b is 0.2 mm, and a distance in the Y-Y' direction between the first ground conductor 500a and the third TX electrode 300c is 0.2 mm.

As illustrated in FIG. 2C, the second ground conductor 500b has a generally rectangular shape with the four corners cut away, and is provided on the first face 121 of the second dielectric 120. The second ground conductor 500b is located on the Z'-direction side relative to the electrode body 210 of the RX electrode 200 and the first TX electrode 300a such as to overlap the electrode body 210 of the RX electrode 200 and the first TX electrode 300a. The second ground conductor 500b is located on the Z-direction side relative to the second TX electrode 300b, the third TX electrode 300c, and the first ground conductor 500a such as to overlap the second TX electrode 300b, the third TX electrode 300c, and the first ground conductor 500a. The second ground conductor 500b is provided with the first openings 501b (there are twelve of them), which serve to avoid interference with the respective twelve first through-hole electrodes 300d, the second openings 502b (there are twelve of them), which serve to avoid interference the with the respective twelve second through-hole electrodes 300e, and the third opening 503b, which serves to avoid interference with the fourth conductor 214 of the RX electrode 200.

The second ground conductor 500b has a dimension in the Y-Y' direction that is equal to the dimension in the Y-Y' direction of the first TX electrode 300a, a dimension in the X-X' direction of 62.5 mm, and a dimension in the Z-Z' direction of 0.041 mm.

An end portion on the X-direction side of the first ground conductor 500a and an end portion on the X-direction side of the second ground conductor 500b are connected by four of the third through-hole electrodes 500c on the X-direction side, and an end portion on the X'-direction side of the first ground conductor 500a and an end portion on the X'-direction side of the second ground conductor 500b are connected by another four of the third through-hole electrodes 500c on the X'-direction side. The third conductor 330a of the first TX electrode 300a is provided with four of the second openings 302a, which serve to avoid interference with the respective four third through-hole electrodes 500c on the X-direction side. The fourth conductor 340a of the first TX electrode 300a is provided with another four of the second openings 302a, which serve to avoid interference with the respective four third through-hole electrodes 500c on the X'-direction side.

The first wiring 400 includes the first portion 410, the second portion 420, the third portion 430, and the fourth portion 440. As illustrated in FIGS. 1A and 2A to 2D, the second portion 420 is the through-hole electrode located on the X'-direction side (on an outer side) relative to the first TX electrode 300a. As illustrated in FIG. 2B, the first portion 410 is the conductive line on the second face 112 of the first dielectric 110 and extends, with two bends, from the fourth conductor 214 of the RX electrode 200 to the second portion 420. As illustrated in FIGS. 1A and 2A, the third portion 430 is the conductive line provided on the first face 111 of the first dielectric 110, and extend from the second portion 420 to the fourth portion 440. The first wiring 400 has a dimension in the Z-Z' direction of 0.041 mm.

Figure 5A:
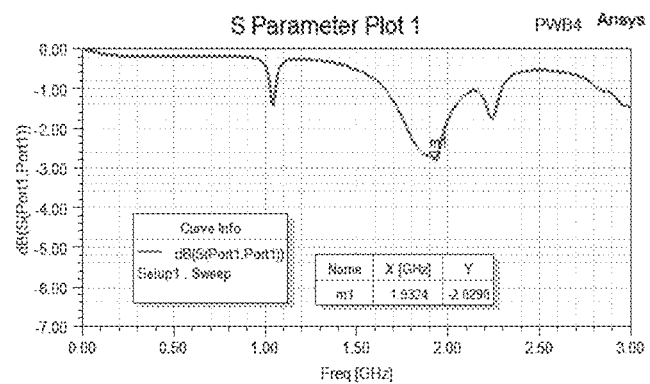
FIG. 5A is a graph regarding S-parameters obtained by simulating a first model.
Figure 5B:
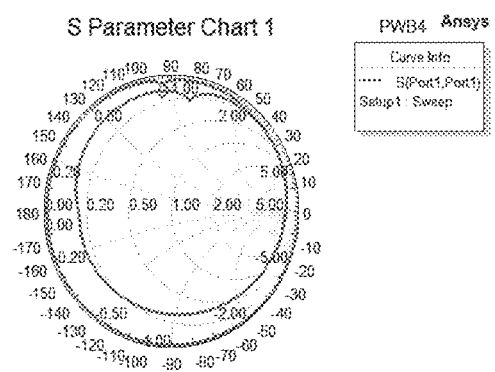
FIG. 5B is a chart regarding S-parameters obtained by simulating the first model.
Figure 5C:
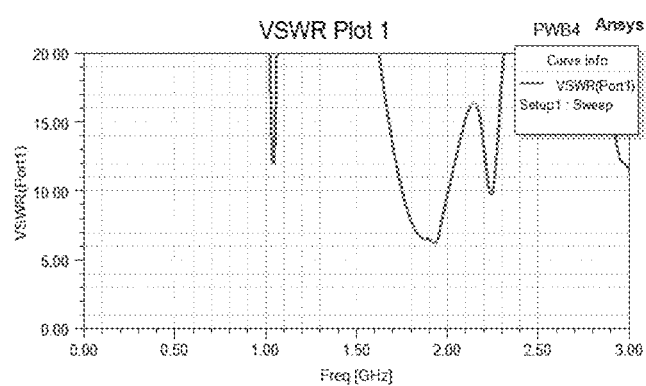
FIG. 5C is a graph regarding VSWRs obtained by simulating the first model.

In the first simulation conducted in the EM simulator, the fourth portion 440 of the first wiring 400 was set to Port 1, analysis signals were set to a frequency band of 0 to 3 GHz, and then the S-parameters (S11) of the RX electrode 200 of the first model were analyzed. The results obtained from the first simulation are shown in FIGS. 5A to 5C.

[Conditions of second simulation] CAD data of the touch sensor S of the first embodiment as illustrated in FIGS. 1A to 2D were input to the EM simulator. On the basis of the CAD data, a second model was created using the EM simulator. The second model has the same configuration as the first model, except that the dimension of the gap G is 1.0 mm.

Figure 6A:
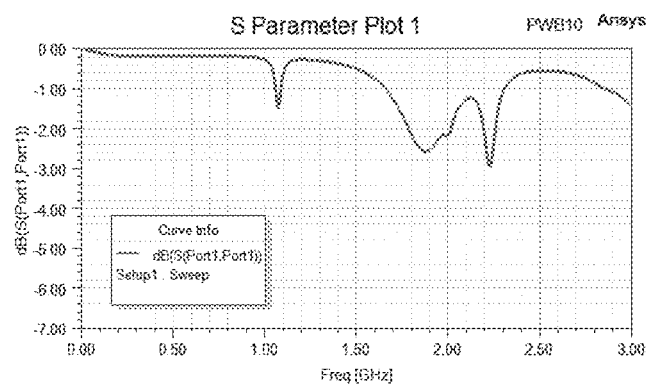
FIG. 6A is a graph regarding S-parameters obtained by simulating the second model.
Figure 6B:
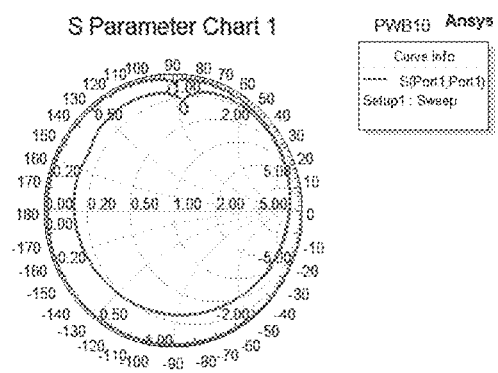
FIG. 6B is a chart regarding S-parameters obtained by simulating the second model.
Figure 6C:
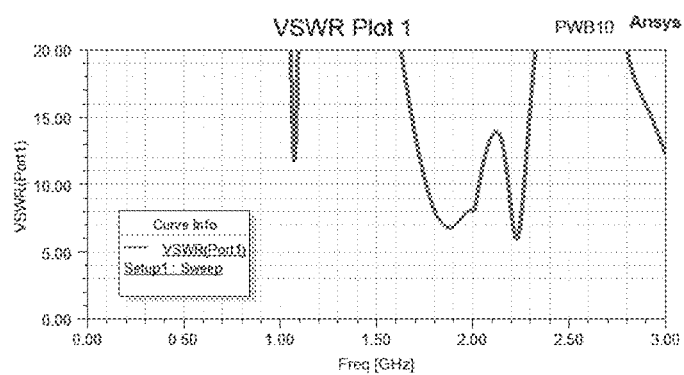
FIG. 6C is a graph regarding VSWRs obtained by simulating the second model.

In the second simulation conducted in the EM simulator, the fourth portion 440 of the first wiring 400 was set to Port 1, analysis signals were set to a frequency band of 0 to 3 GHz, and then the S-parameters (S11) of the RX electrode 200 of the second model were analyzed. The results obtained from the second simulation are shown in FIGS. 6A to 6C.

[Conditions of third simulation] CAD data of the touch sensor S of the first embodiment as illustrated in FIGS. 1A to 2D were input to the EM simulator. On the basis of the CAD data, a third model was created using the EM simulator. The third model has the same configuration as the first model, except that the dimension of the gap G is 2.0 mm.

Figure 7A:
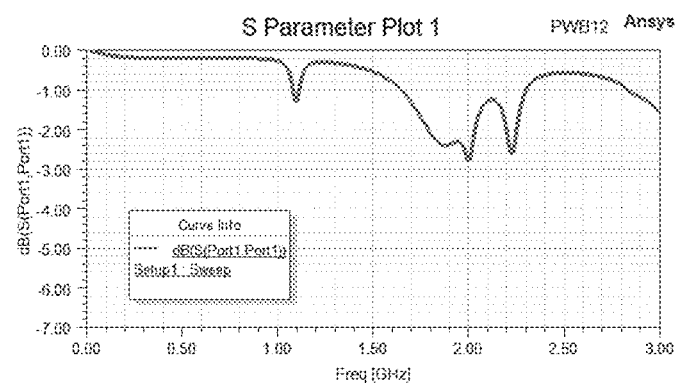
FIG. 7A is a graph regarding S-parameters obtained by simulating a third model.
Figure 7B:
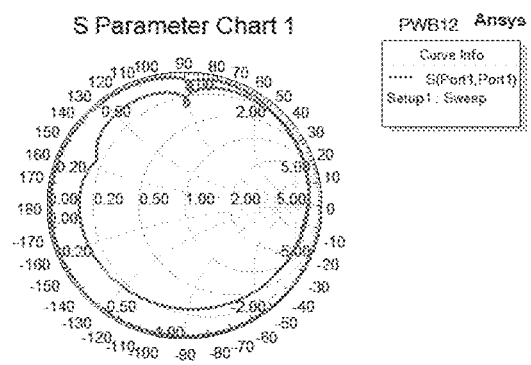
FIG. 7B is a chart regarding S-parameters obtained by simulating the third model.
Figure 7C:
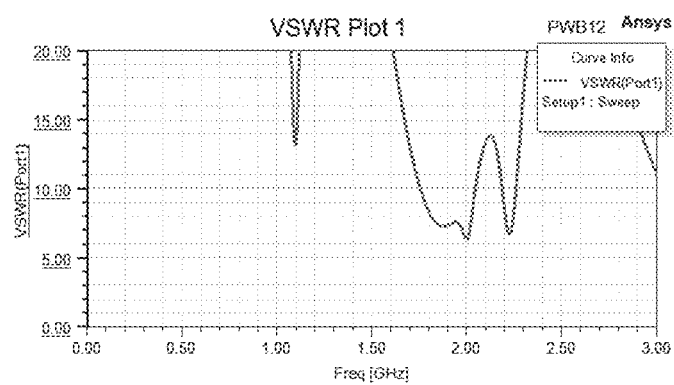
FIG. 7C is a graph regarding VSWRs obtained by simulating the third model.

In the third simulation conducted in the EM simulator, the fourth portion 440 of the first wiring 400 was set to Port 1, analysis signals were set to a frequency band of 0 to 3 GHz, and then the S-parameters (S11) of the RX electrode 200 of the third model were analyzed. The results obtained from the third simulation are shown in FIGS. 7A to 7C.

Figure 3:
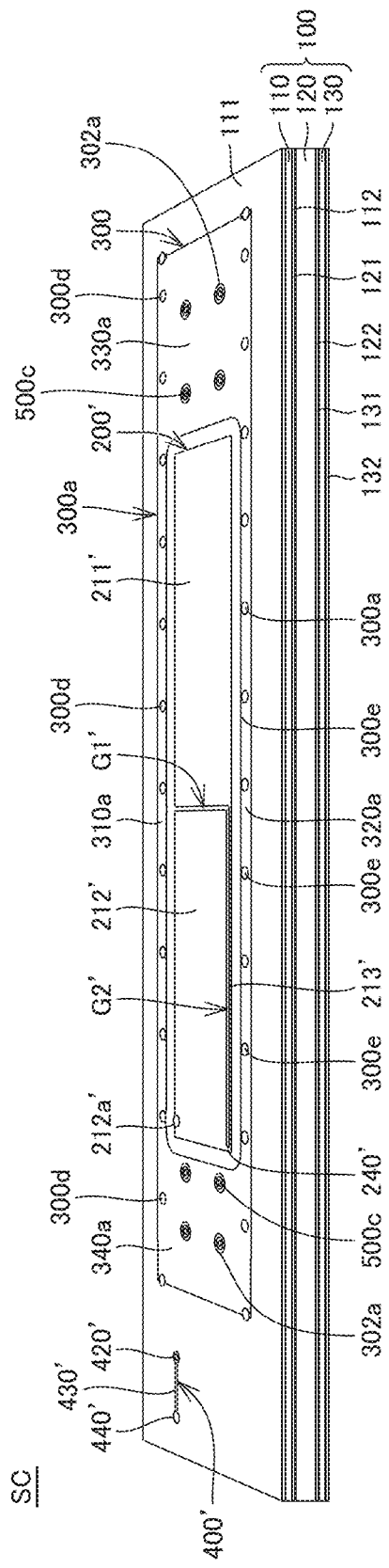
FIG. 3 is a schematic perspective view of a capacitive touch sensor according to a comparative example.
Figure 4A:
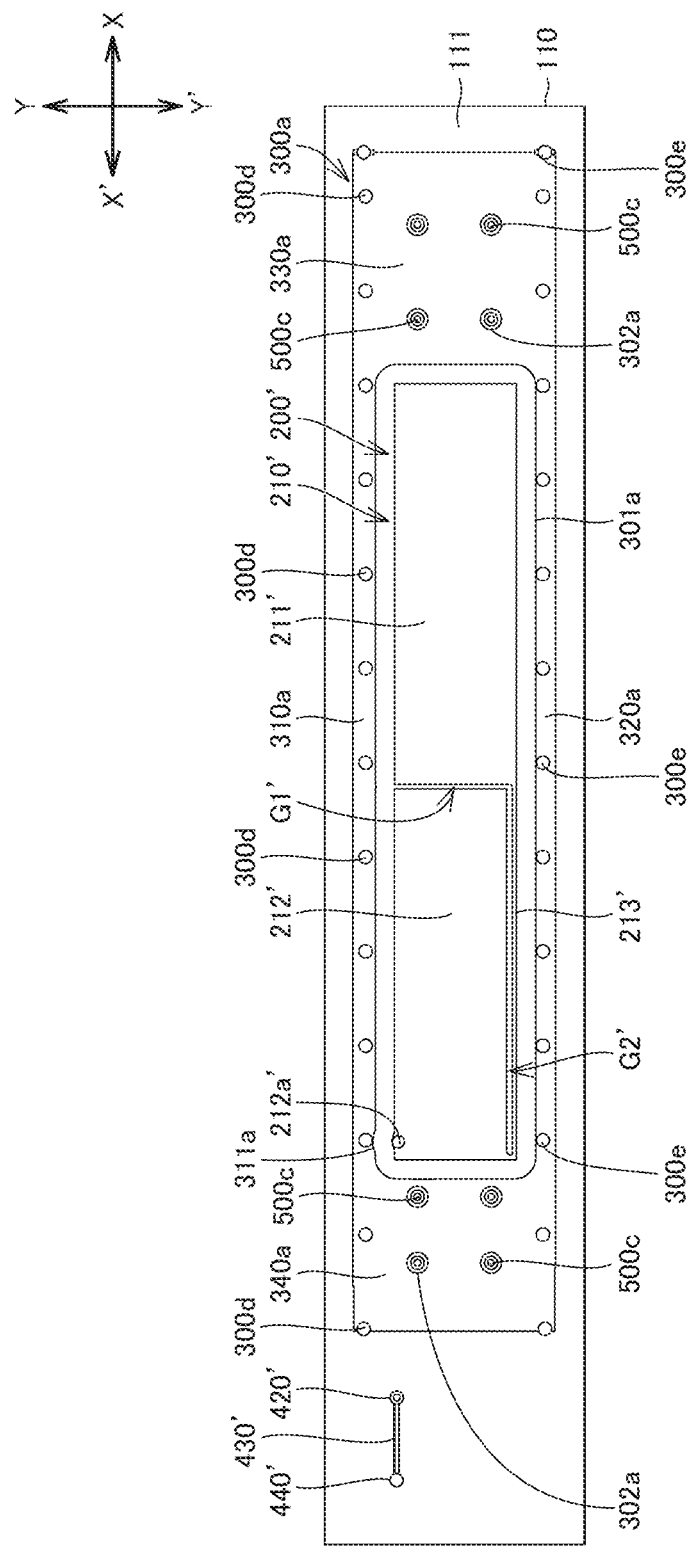
FIG. 4A is a schematic plan view of a first dielectric of a base of the touch sensor of the comparative example.
Figure 4B:
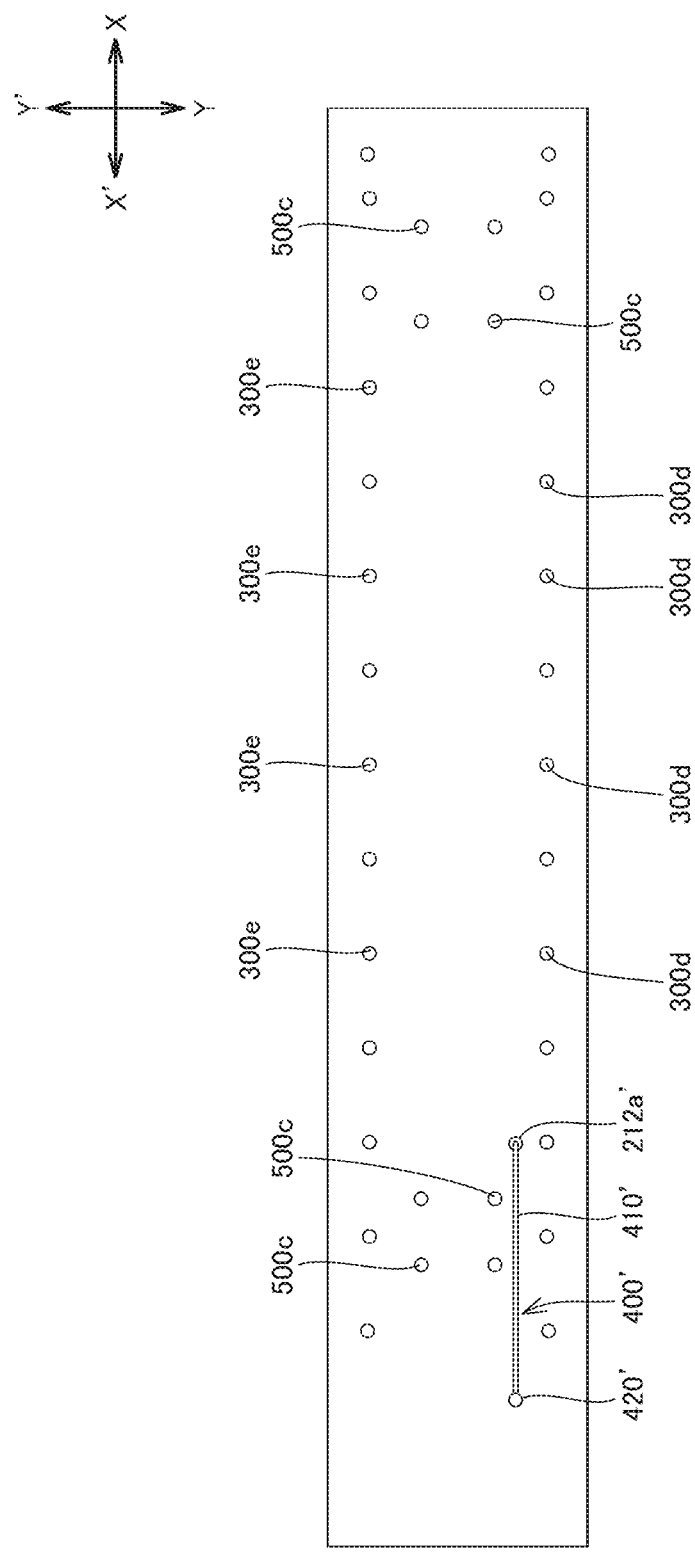
FIG. 4B is a schematic bottom view of the first dielectric of the base of the touch sensor of the comparative example.

[Conditions of fourth simulation] CAD data of the touch sensor SC of the comparative example as illustrated in FIGS. 3 to 4B were input to the EM simulator. On the basis of the CAD data, a fourth model was created using the EM simulator.

The fourth model has the same configuration as the first model, except that the RX electrode 200 is replaced with an RX electrode 200' and the first wiring 400 is replaced with a first wiring 400'. Accordingly, the fourth model will now be described focusing on the differences from the first model and omitting overlapping descriptions.

As illustrated in FIGS. 3 and 4A, an electrode body 210' of the RX electrode 200' and the first TX electrode 300a of the TX electrode 300 are provided on the first face 111 of the first dielectric 110. The electrode body 210' of the RX electrode 200' includes a rectangular first conductor 211', a rectangular second conductor 212', and a connection line 213'. The first conductor 211' and the second conductor 212' are rectangular conductors extending in the X-X' direction, and are located close to each other with a gap G1' therebetween in the X-X' direction. The connection line 213' has a generally L shape and includes a first line and a second line. The first line extends in the X' direction from the first conductor 211' and is located close to the second conductor 212' with a gap G2' in the Y-Y' direction. The second line extends in the Y direction from an end portion on the X-direction side of the first line to the second conductor 212'. The second conductor 212' includes a connecting portion 212a' in addition to the rectangular conductor. The connecting portion 212a' is a through-hole electrode extending in the Z-Z' direction through the first dielectric 110, the second dielectric 120, and the one third dielectric 130, and is connected to a corner on the Y- and X'-direction side of the conductor of the second conductor 212'. The connecting portion 212a' is located such as to partly protrude relative to an end on the Y-direction side of the second conductor 212'.

The RX electrode 200' has a dimension in the Y-Y' direction of 6.5 mm, and a dimension in the X-X' direction of 41.15 mm, and a dimension in the Z-Z' direction of 0.051 mm. The first conductor 211' has a dimension in the Y-Y' direction of 6.5 mm and a dimension in the X-X' direction of 21.25 mm. The conductor of the second conductor 212' has a dimension in the Y-Y' direction of 5.95 mm and a dimension in the X-X' direction of 19.65 mm. The first line of the connection line 213' has a dimension in the Y-Y' direction of 0.25 mm, and the second line of the connection line 213' has a dimension in the Y-Y' direction of 0.3 mm. The distance in the X-X' direction between the first conductor 211' and the second conductor 212' is a constant distance of 0.25 mm. The distance in the Y-Y' direction between the second conductor 212' and the first line of the connection line 213' is a constant distance of 0.3 mm.

The first TX electrode 300a has a generally square ring shape surrounding the electrode body 210' of the RX electrode 200'. The first conductor 310a of the first TX electrode 300a has a generally rectangular shape extending in the X-X' direction and is located in spaced relation to, and on the Y-direction side relative to, the electrode body 210' of the RX electrode 200'. The first conductor 310a of the first TX electrode 300a is provided with a recess 311a recessed to the Y-direction side. The second conductor 320a of the first TX electrode 300a has a generally rectangular shape extending in the X-X' direction, and is located in spaced relation to, and on the Y'-direction side relative to, the electrode body 210' of the RX electrode 200'. The third conductor 330a of the first TX electrode 300a is located in spaced relation to, and on the X-direction side relative to, the electrode body 210' of the RX electrode 200'. The fourth conductor 340a of the first TX electrode 300a is located in spaced relation to, and on the X'-direction side relative to, the electrode body 210' of the RX electrode 200'.

A distance in the Y-Y' direction between the electrode body 210' of the RX electrode 200' and the first conductor 310a of the first TX electrode 300a is 1 mm, and a distance in the Y-Y' direction between the electrode body 210' of the RX electrode 200' and the second conductor 320a of the first TX electrode 300a is also 1 mm. A distance in the X-X' direction between the electrode body 210' of the RX electrode 200' and the third conductor 330a of the first TX electrode 300a is 1 mm, and a distance in the X-X' direction between the electrode body 210' of the RX electrode 200' and the fourth conductor 340a of the first TX electrode 300a is also 1 mm.

The first wiring 400' includes a first portion 410', a second portion 420', a third portion 430', and a fourth portion 440'. As illustrated in FIGS. 3, 4A, and 4B, the second portion 420' is a through-hole electrode, and is located on the X'-direction side (on an outer side) relative to the first TX electrode 300a. As illustrated in FIG. 4B, the first portion 410' is a linear conductive line on the second face 112 of the first dielectric 110, and extends from the connecting portion 212a' of the RX electrode 200' to the second portion 420'. As illustrated in FIGS. 3 and 4A, the third portion 430' is a conductive line on the first face 111 of the first dielectric 110, and extends from the second portion 420' to the fourth portion 440'. The first wiring 400' has a dimension in the Z-Z' direction of 0.041 mm.

In the fourth simulation conducted in in the EM simulator, the fourth portion 440' of the first wiring 400' was set to Port 1, analysis signals were set to a frequency band of 0 to 3 GHz, and then the S-parameters (S11) of the RX electrode 200' of the fourth model were analyzed. The results obtained from the fourth simulation are shown in FIGS. 8A to 8C.

The results of the first to fourth simulations are compared to find as follows. FIG. 5A is a graph in which the horizontal axis represents the frequencies of the analysis signals and the vertical axis represents the S-parameters (S11) of the RX electrode 200 of the first model. FIG. 6A is a graph in which the horizontal axis represents the frequencies of the analysis signals and the vertical axis represents the S-parameters (S11) of the RX electrode 200 of the second model. FIG. 7A is a graph in which the horizontal axis represents the frequencies of the analysis signals and the vertical axis represents the S-parameters (S11) of the RX electrode 200 of the third model. FIG. 8A is a graph in which the horizontal axis represents the frequencies of the analysis signals and the vertical axis represents the S-parameters (S11) of the RX electrode 200' of the fourth model.

Figure 8A:
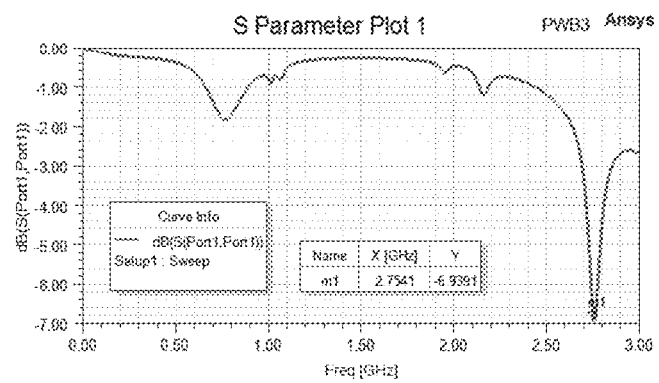
FIG. 8A is a graph regarding S-parameters obtained by simulating a fourth model.
Figure 8B:
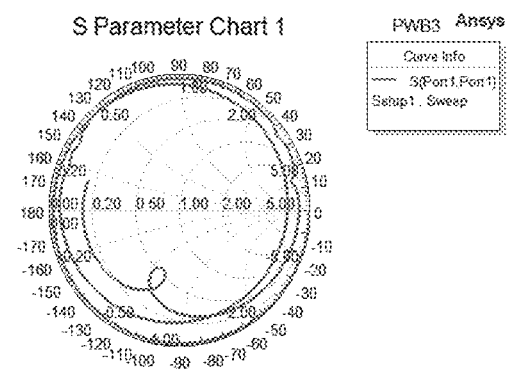
FIG. 8B is a chart regarding S-parameters obtained by simulating the fourth model.
Figure 8C:
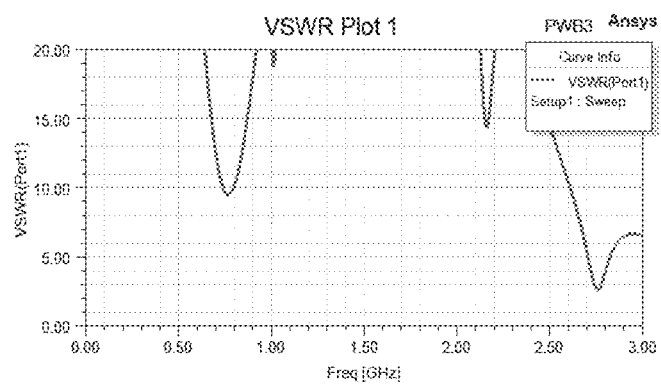
FIG. 8C is a graph regarding VSWRs obtained by simulating the fourth model.

FIG. 8A shows that, in the RX electrode 200' of the fourth model, the S-parameters (S11) takes a value of −7.00 dB near a frequency of the peak (2.75 GHz), which shows that the RX electrode 200' has a low return loss (reflection loss). As the RX electrode 200' has a low return loss (reflection loss), there is a good match between the impedance of the RX electrode 200' and the impedance of the first wiring 400 with respect to the connecting portion of the RX electrode 200', resulting in that the RX electrode 200' provides a good radiation efficiency. Specifically, the RX electrode 200' of the fourth model provides a radiation efficiency of 80%. Such high radiation efficiency also means that the RX electrode 200' of the fourth model has a high reception efficiency near the same frequency (2.75 GHz). Therefore, it is therefore shown that the RX electrode 200' of the fourth model is susceptible to external noise near the same frequency (2.75 GHz).

In contrast, FIG. 5A shows that, in the RX electrode 200 of the first model, the S-parameters (S11) takes a value of −0.80 dB near the same frequency (2.75 GHz), which shows that the RX electrode 200' has a higher return loss than the return loss of the RX electrode 200' of the fourth model. FIG. 6A shows that, also in the RX electrode 200 of the second model, the S-parameters (S11) takes a value of −0.80 dB near the same frequency (2.75 GHz), which shows that the RX electrode 200' has a higher return loss than the return loss of the RX electrode 200' of the fourth model. FIG. 7A shows that, also in the RX electrode 200 of the second model, the S-parameters (S11) takes a value of −0.80 dB near the same frequency (2.75 GHz), which shows that the RX electrode 200' has a higher return loss than the return loss of the RX electrode 200' of the fourth model. As the RX electrodes 200 of the first to third models each have a higher return loss (reflection loss) as described above, there is a mismatch between the impedance of the RX electrode 200 and the impedance of the first wiring 400 with respect to the connecting portion of the RX electrode 200, resulting in that the RX electrode 200' provides a poor radiation efficiency. Specifically, the RX electrodes 200 of the first to third models each provide a radiation efficiency of 17%, and it is accordingly expected that the radiation efficiency of the RX electrodes 200 of the first to third models is decreased by about 63 percentage points, as compared with the radiation efficiency of the RX electrode 200' of the fourth model, near the same frequency (2.75 GHz). Such a decrease in radiation efficiency also means that the RX electrodes 200 of the first to third models each have a lower reception efficiency near the same frequency (2.75 GHz) than the reception efficiency of the RX electrode 200' of the fourth model does. It has been thus found that the RX electrodes 200 of the first to third models are less susceptible to external noise having a frequency near the same frequency (2.75 GHz).

As described above, the RX electrodes 200 of the first, second, and third models have the same configuration except that their respective gaps G have different dimensions, namely 0.2 mm, 1.0 mm, and 2.0 mm, respectively. It is assumed that with increase in dimension of the gap G, an electric field generated in the first conductor 211 and an electric field generated in the second conductor 212 offset each other to a lesser degree because of current flows in opposite directions through the first conductor 211 and the second conductor 212 with the current flows induced by application of external noise to the electrode body 210 of the RX electrode 200. However, FIGS. 5A, 6A, and 7A show that, comparing the results of the first to third simulations, there are no significant changes in the waveforms of the S-parameters (S11) among the RX electrodes 200 of the first to third models in the frequency band of 0 GHz to 3 GHz of the analysis signals. In other words, changes in dimension of the gap G described above will not significantly change the reflection efficiency (reception efficiency) in the RX electrodes 200 of the first to third models. Therefore, it can be said that the RX electrodes 200 of the first to third models are substantially equally less susceptible to external noise in the frequency band of 0 to 3 GHz of the analysis signals. However, if the gap G has a smaller dimension, the area of the RX electrode 200 becomes larger without changing the outer shape of the RX electrode 200 as viewed from the Z-direction side, and the application of external noise induces current flows in opposite directions through the first conductor 211 and the second conductor 212, so that an electric field generated in the first conductor 211 and an electric field generated in the second conductor 212 offset each other to a larger degree. It is therefore preferable to decrease the dimension of the gap G.

As a result of comparison of the above simulations, it can be said that the RX electrodes 200 of the first to third models are less susceptible to external noise in specific frequencies than the RX electrode 200' of the fourth model. Note that the specific frequencies of the external noise are not limited to the above-described example (about 2.75 GH), presumably change depending on the shapes of the RX electrodes 200 of the first to third models and the RX electrode 200' of the fourth model, the shapes and arrangement of the TX electrodes 300 and other conductors around the RX electrodes, the shape and arrangement the controller 600 and other circuits (only if such circuits are provided), and other factors.

The RX electrode for the touch sensor and the touch sensor described above are not limited to the embodiments described above, but may be modified as appropriate within the scope of the claims. Some examples of modification are described below.

The dimension of the gap G is not limited to a range of from 2 mm to 0.05 mm or from 1 mm to 0.05 mm, but may be any dimension that makes it possible that the application of external noise induces current flows in opposite directions through the first conductor 211 and the second conductor 212 so that an electric field generated in the first conductor 211 and an electric field generated in the second conductor 212 offset each other.

The TX electrode 300 according to any of the above aspects may include a fourth TX electrode (not illustrated) in addition to, or in place of, the first TX electrode 300a. Where the at least one dielectric of the base 100 has one of configurations (1) to (3) described above, the fourth TX electrode is provided on a face that is either the first or second face of one dielectric of all the dielectrics (either the first or second face of one dielectric of the at least one dielectric) of the base 100 and that is not provided with the electrode body 210 of the RX electrode 200. Where the at least one dielectric of the base 100 has configuration (2) or (3) described above, the fourth TX electrode is provided on the first or second face of another dielectric, other than one dielectric that is provided with the electrode body 210 of the RX electrode 200, of all the dielectrics (the at least one dielectric) of the base 100. The fourth TX electrode has a dimension in the Y-Y' direction that is larger than the dimension in the Y-Y' direction of the RX electrode 200 of one of the aspects described above. The fourth TX electrode includes the second TX electrode 300b and the third TX electrode 300c. In other words, the end portion on the Y-direction side of the fourth TX electrode is the second TX electrode 300b, and the end portion on the Y'-direction side of the fourth TX electrode is the third TX electrode 300c. It should be noted that the fourth TX electrode and the first TX electrode 300a are not provided on one and the same face of one dielectric. The TX electrode 300 according to one of the above aspects is only required to include at least one of the first TX electrode 300a, the second TX electrode 300b, or the third TX electrode 300c.

The RX electrode 200 according to any of the above aspects and the TX electrode 300 according to any of the above aspects may be made of a metal plate or the like. In this case, the base 100 may be omitted or may hold the RX electrode 200 and the TX electrode 300.

The touch sensor S according to any of the above aspects may be of a self-capacitance type or a mutual capacitance type. Where the touch sensor S is a self-capacitance type, the TX electrode 300 is omitted, and the controller 600 or the external controller is configured to electrically charge and discharge the RX electrode 200 via the first wiring 400, and configured to monitor signals (voltage, current, etc.) of the RX electrode 200, which change in accordance with a change in self-capacitance, and simultaneously compare the signals of the RX electrode 200 with a threshold stored on a memory internal and external to the controller and, when determining by the comparison that the signal of the RX electrode 200 has exceeded the threshold, to detect an approach of the detection target to a portion on the Z-direction side relative to the RX electrode 200 (detect a touch of the detection target, or the like). The controller 600 or the external controller is not configured to supply drive pulses to the TX electrode 300. Where the touch sensor S is of the mutual capacitance type, the controller 600 or the external controller is configured to supply drive pulses to the TX electrode 300, and configured to monitor signals (voltage, current, etc.) of the RX electrode 200, which change in accordance with a change in mutual capacitance, and simultaneously compare the signals of the RX electrode 200 with a threshold stored on a memory internal and external to the controller and, when determining by the comparison that the signal of the RX electrode 200 has exceeded the threshold, to detect an approach of the detection target to a portion on the Z-direction side relative to the RX electrode 200 (detect a touch of the detection target, or the like). In this case, the controller 600 or the external controller is not configured to electrically charge and discharge the RX electrode 200 via the first wiring 400.

The touch sensor S according to any of the above aspects may be a touch sensing panel to detect a coordinate position in a touch area. Where the touch sensor S is of a combined self-capacitive and mutual-capacitive type or a mutual capacitance type, the touch sensor S may include a plurality of RX electrodes 200, each of which is according to one of the above aspects, and a plurality of TX electrodes 300, each of which is according to any one of the above aspects. Where the touch sensor S is a self-capacitance type, the touch sensor S may include a plurality of RX electrodes 200, each of which is according to any one of the above aspects. In the touch panel S of any aspects above, the controller 600 or the external controller is configured to detect a coordinate position of the touch area based on a signal of the RX electrode(s) 200 that is determined to have exceeded the threshold through the comparison described above.

REFERENCE SIGNS LIST

S: touch sensor
100: base; 110: first dielectric; 111: first face of first dielectric; 112: second face of first dielectric; 120: second dielectric; 121: first face of second dielectric; 122: second face of second dielectric; 130: third dielectric; 131: first face of third dielectric; 132: second face of third dielectric
200: RX electrode; 210: electrode body; 211: first conductor; 212: second conductor; 213: third conductor; 214: fourth conductor; G: gap
300: TX electrode; 300a: first TX electrode; 310a: first conductor of first TX electrode; 320a: second conductor of first TX electrode; 330a: third conductor of first TX electrode; 340a: fourth conductor of first TX electrode; 300b: second TX electrode; 300c: third TX electrode; 300d: first through-hole electrode; 300e: second through-hole electrode
400: first wiring; 410: first portion of first wiring; 420: second portion of first wiring; 430: third portion of first wiring; 440: fourth portion of first wiring
500a: first ground conductor; 500b: second ground conductor
600: controller

What is claimed is:

1. An RX electrode for a capacitive touch sensor, the RX electrode comprising:
    an electrode body including a first conductor, a second conductor, a third conductor, and a fourth conductor, wherein
    the first and second conductors are located close to each other with a gap therebetween in a first direction and extend in a second direction, the first direction being an array direction of the first and second conductors and the second direction being substantially orthogonal to the first direction,
    the first and second conductors are configured such that application of external noise to the electrode body induces current flows in opposite directions through the first and second conductors, so that an electric field generated in the first conductor and an electric field generated in the second conductor offset each other,
    the first and second conductors each include a first end portion on one side in the second direction and a second end portion on the other side in the second direction,
    the third conductor connects the first end portion of the first conductor and the first end portion of the second conductor, and is located on the one side in the second direction relative to the gap between the first conductor and the second conductor,
    the fourth conductor connects the second end portion of the first conductor and the second end portion of the second conductor, and is located on the other side in the second direction relative to the gap between the first conductor and the second conductor, and
    one of the first, second, third, or fourth conductor includes a connecting portion.

2. The RX electrode according to claim 1, wherein a maximum distance in the first direction between the first conductor and the second conductor is 0.05 mm or larger.

3. The RX electrode according to claim 2, wherein the maximum distance in the first direction between the first conductor and the second conductor is from 2 mm to 0.05 mm.

4. A capacitive touch sensor comprising:
    a base having an insulating property;
    the RX electrode according to claim 1, the RX electrode being provided at the base; and
    a TX electrode provided at the base and located near the RX electrode, wherein
    a signal of the RX electrode changes in accordance with a change in electrostatic capacitance between a detection target and the RX electrode caused by approach of the detection target to the RX electrode, and in accordance with a change in electrostatic capacitance between the TX electrode and the RX electrode caused by approach of the detection target to the TX electrode and the RX electrode.

5. The capacitive touch sensor according to claim 4, wherein
    the base includes at least one dielectric having an insulating property, and
    the TX electrode and the electrode body of the RX electrode are provided on one and the same face of one dielectric of the at least one dielectric.

6. The capacitive touch sensor according to claim 5, wherein the maximum distance in the first direction between the first conductor and the second conductor is from 2 mm to 0.05 mm.

7. The capacitive touch sensor according to claim 4, wherein
    the base includes a plurality of dielectrics having an insulating property and being stacked together, and
    the TX electrode and the electrode body of the RX electrode are provided on different faces of one dielectric of the plurality of dielectrics, or alternatively the TX electrode is provided on a face of one dielectric of the plurality of dielectrics and the electrode body of the RX electrode is provided on a face of another dielectric, other than the one dielectric, of the plurality of dielectrics.

8. The capacitive touch sensor according to claim 7, wherein the maximum distance in the first direction between the first conductor and the second conductor is from 2 mm to 0.05 mm.

9. The capacitive touch sensor according to claim 4, wherein
    the TX electrode includes a first TX electrode having a generally ring shape and surrounding the RX electrode,
    the first TX electrode includes:
        a first conductor extending in the second direction, being located on one side in the first direction relative to the first conductor of the RX electrode, and including a first end portion on the one side in the second direction and a second end portion on the other side in the second direction,
        a second conductor extending in the second direction, being located on the other side in the first direction relative to the second conductor of the RX electrode, and including a first end portion on the one side in the second direction and a second end portion on the other side in the second direction,
        a third conductor extending from the first end portion of the first conductor of the first TX electrode to the first end portion of the second conductor of the first TX electrode, and being located on the one side in the second direction relative to the RX electrode, and
        a fourth conductor extending from the second end portion of the first conductor of the first TX electrode to the second end portion of the second conductor of the first TX electrode, and being located on the other side in the second direction relative to the RX electrode.

10. The capacitive touch sensor according to claim 9, wherein the maximum distance in the first direction between the first conductor and the second conductor is from 2 mm to 0.05 mm.

11. The capacitive touch sensor according to claim 4, wherein
the TX electrode includes at least one of a second TX electrode or a third TX electrode,
the second TX electrode extends in the second direction and is located on one side in the first direction relative to the first conductor of the RX electrode, and
the third TX electrode extends in the second direction and is located on the other side in the first direction relative to the second conductor of the RX electrode.

12. The capacitive touch sensor according to claim 4, wherein
the base includes at least one dielectric having an insulating property,
the TX electrode includes a first TX electrode having a generally ring shape,
the first TX electrode is provided on a face that is either a first or second face of one dielectric of the at least one dielectric and that is provided with the electrode body of the RX electrode, surrounds the RX electrode, and includes:
a first conductor extending in the second direction, being located on one side in the first direction relative to the first conductor of the RX electrode, and including a first end portion on the one side in the second direction and a second end portion on the other side in the second direction,
a second conductor extending in the second direction, being located on the other side in the first direction relative to the second conductor of the RX electrode, and including a first end portion on the one side in the second direction and a second end portion on the other side in the second direction,
a third conductor extending from the first end portion of the first conductor of the first TX electrode to the first end portion of the second conductor of the first TX electrode, and being located on the one side in the second direction relative to the RX electrode, and
a fourth conductor extending from the second end portion of the first conductor of the first TX electrode to the second end portion of the second conductor of the first TX electrode, and being located on the other side in the second direction relative to the RX electrode,
the TX electrode further includes at least one of a second TX electrode or a third TX electrode,
the second TX electrode is provided on a face that is either a first or second face of one dielectric of the at least one dielectric and that is not provided with the electrode body of the RX electrode, or alternatively provided on a face of another dielectric, other than the one dielectric that is provided with the electrode body of the RX electrode,
the second TX electrode extends in the second direction and is located on one side in the first direction relative to the first conductor of the RX electrode,
the third TX electrode is provided on a face that is either the first or second face of the one dielectric of the at least one dielectric and that is not provided with the electrode body of the RX electrode, or alternatively provided on the face of another dielectric, other than the one dielectric that is provided with the electrode body of the RX electrode, and
the third TX electrode extends in the second direction and is located on the other side in the first direction relative to the second conductor of the RX electrode.

13. The capacitive touch sensor according to claim 12, wherein
the first TX electrode is provided on the first face of the one dielectric of the at least one dielectric,
the second TX electrode is provided on the second face of the one dielectric of the at least one dielectric, or alternatively provided on the face of the another dielectric of the at least one dielectric,
the third TX electrode is provided on the second face of the one dielectric of the at least one dielectric, or alternatively provided on the face of the another dielectric of the at least one dielectric,
the capacitive touch sensor further comprises at least one ground conductor including a first ground conductor,
the first ground conductor is provided on the second face of the one dielectric of the at least one dielectric, or alternatively provided on the face of the another dielectric of the at least one dielectric, and
the first ground conductor is located between, and in spaced relation to, the second TX electrode and the third TX electrode, and located on the other side in a third direction relative to the electrode body of the RX electrode such as to overlap the electrode body of the RX electrode, the third direction being substantially orthogonal to the first and second directions and including one side in the third direction and the other side in the third direction.

14. The capacitive touch sensor according to claim 12, wherein
the at least one dielectric includes a plurality of dielectrics having an insulating property and being stacked together in a third direction substantially orthogonal to the first and second directions,
the first TX electrode is provided on the first face of the one dielectric of the plurality of dielectrics,
the second TX electrode is provided on the second face of the one dielectric of the plurality of dielectrics, or alternatively provided on the face of the another dielectric of the plurality of dielectrics,
the third TX electrode is provided on the second face of the one dielectric of the plurality of dielectrics, or alternatively provided on the face of the another dielectric of the plurality of dielectrics,
the capacitive touch sensor further comprises at least one ground conductor including a second ground conductor,
the second ground conductor is provided on another face of the dielectrics, and located in the third direction such as to overlap the electrode body of the RX electrode, the first TX electrode, the second TX electrode, and the third TX electrode, and
the another face is different from the face provided with the first TX electrode and the face provided with the second TX electrode and the third TX electrode.

15. The capacitive touch sensor according to claim 12, wherein
the base includes at least one dielectric having an insulating property,
the first conductor and the second conductor of the RX electrode is provided on a first or second face of one dielectric of the at least one dielectric, the third conductor of the RX electrode is provided on the face that is either the first or second face of the one dielectric of the at least one dielectric and that is provided with the first conductor and the second conductor of the RX electrode, the fourth conductor of the RX electrode includes the connecting portion, the fourth conductor of the RX electrode is a through-hole electrode extending in a third direction through the at least one dielectric, a via-hole electrode extending in the third direction through one or more dielectrics of the at least one dielectric, or an electrode provided on the face that is either the first or second face of the one dielectric of the at least one dielectric and that is provided with the first conductor and the second conductor of the RX electrode, the third direction being substantially orthogonal to the first and second directions, the fourth conductor of the RX electrode is located such as to partly protrude relative to an end on the other side in the second direction of the second end portion of the first conductor and relative to an end on the other side in the second direction of the second end portion of the second conductor, and the fourth conductor of the first TX electrode is provided with a recess recessed to the other side in the second direction.

16. The capacitive touch sensor according to claim 4, wherein the base includes at least one dielectric having an insulating property, the first conductor and the second conductor of the RX electrode is provided on a first or second face of one dielectric of the at least one dielectric, the third conductor of the RX electrode is provided on the face that is either the first or second face of the one dielectric of the at least one dielectric and that is provided with the first conductor and the second conductor of the RX electrode, the fourth conductor of the RX electrode includes the connecting portion, and the fourth conductor of the RX electrode is a through-hole electrode extending in a third direction through the at least one dielectric, a via-hole electrode extending in the third direction through one or more dielectrics of the at least one dielectric, or an electrode provided on the face that is either the first or second face of the one dielectric of the at least one dielectric and that is provided with the first conductor and the second conductor of the RX electrode, the third direction being substantially orthogonal to the first and second directions.

17. The capacitive touch sensor according to claim 4, wherein the maximum distance in the first direction between the first conductor and the second conductor is from 2 mm to 0.05 mm.

18. A noise reduction method for reducing external noise applied to an RX electrode of a capacitive touch sensor, wherein the RX electrode includes an electrode body, the electrode body includes a first conductor, a second conductor, a third conductor, and a fourth conductor, the first and second conductors are located close to each other with a gap therebetween in a first direction and extend in a second direction, the first direction being an array direction of the first and second conductors and the second direction being substantially orthogonal to the first direction, and the first and second conductors each include a first end portion on one side in the second direction and a second end portion on the other side in the second direction, the third conductor connects the first end portion of the first conductor and the first end portion of the second conductor, and is located on the one side in the second direction relative to the gap between the first conductor and the second conductor, the fourth conductor connects the second end portion of the first conductor and the second end portion of the second conductor, and is located on the other side in the second direction relative to the gap between the first conductor and the second conductor, any one of the first conductor, the second conductor, the third conductor, and the fourth conductor includes a connecting portion, and the noise reduction method comprises inducing current flows in opposite directions through the first and second conductors, so that an electric field generated in the first conductor and an electric field generated in the second conductor to offset each other, wherein the current flows are induced by application of external noise to the electrode body.

19. The noise reduction method according to claim 18, wherein a maximum distance in the first direction between the first conductor and the second conductor is 0.05 mm or larger.

20. The noise reduction method according to claim 18, wherein a maximum distance in the first direction between the first conductor and the second conductor is from 2 mm to 0.05 mm.

* * * * *